United States Patent
Retzker et al.

(10) Patent No.: US 12,380,354 B1
(45) Date of Patent: Aug. 5, 2025

(54) DETERMINATION OF CHARACTERISTICS OF A MOLECULE BY CONTROLLING COUPLING STRENGTHS BETWEEN QUBITS OF A QUANTUM DEVICE DURING A SERIES OF MEASUREMENTS

(71) Applicant: Amazon Technologies, Inc., Seattle, WA (US)

(72) Inventors: Alex Retzker, Pasadena, CA (US); Yotam Vaknin, Pasadena, CA (US)

(73) Assignee: Amazon Technologies, Inc., Seattle, WA (US)

( * ) Notice: Subject to any disclaimer, the term of this patent is extended or adjusted under 35 U.S.C. 154(b) by 551 days.

(21) Appl. No.: 17/810,186

(22) Filed: Jun. 30, 2022

(51) Int. Cl.
G06N 10/40 (2022.01)
G01N 24/08 (2006.01)

(52) U.S. Cl.
CPC ............. G06N 10/40 (2022.01); G01N 24/08 (2013.01)

(58) Field of Classification Search
CPC ............................. G06N 10/40; G01N 24/08
See application file for complete search history.

(56) References Cited

U.S. PATENT DOCUMENTS 10,101,423 B2  10/2018 Devience et al.
2007/0080341 A1*  4/2007 Macready ............. H04L 9/0852
257/31
2012/0319684 A1* 12/2012 Gambetta ............... G06N 10/40
257/31
2020/0349326 A1* 11/2020 King ....................... G06N 5/01

OTHER PUBLICATIONS

U.S. Appl. No. 17/491,140, filed Sep. 30, 2021, Jeffrey Paul Heckey, et al.
U.S. Appl. No. 16/698,674, filed Nov. 27, 2019, Jeffrey Paul Heckey.
U.S. Appl. No. 16/698,698, filed Nov. 27, 2019, Derek Bolt.
U.S. Appl. No. 16/698,732, filed Nov. 27, 209, Jeffrey Paul Heckey.
U.S. Appl. No. 16/698,737, filed Nov. 27, 2019, Christopher Kasprowicz.
U.S. Appl. No. 17/525,723, filed Nov. 12, 2021, Milan Kmeta.
U.S. Appl. No. 17/525,716, filed Nov. 12, 2021, Milan Kmeta.

(Continued)

*Primary Examiner* — Nghia M Doan
(74) *Attorney, Agent, or Firm* — Alexander A. Knapp; Kowert, Hood, Munyon, Rankin & Goetzel, P.C.

(57) ABSTRACT

A system and method for modeling one or more characteristics of a molecule using a quantum device implemented on quantum hardware is disclosed. Through control, via modulation, of coupling strengths between qubits on the quantum device and a comparison to an experimentally-measured nuclear magnetic resonance spectrum, J-coupling values may be deduced. These J-coupling values may then be used to recover the molecular structure of the given molecule. The control of coupling strengths may take place through an iterative process until convergence to the one or more characteristics is reached. In some embodiments, such a process may be implemented as part of a quantum computing service. In such cases, the quantum hardware may be local to the quantum computing service, or may be outsourced to a quantum hardware provider.

20 Claims, 8 Drawing Sheets

(56) References Cited

OTHER PUBLICATIONS

H. Hogben, M. Krzystyniak, G. Charnock, P. Hore, and I. Kuprov, "Spinach—A software library for simulation of spin dynamics in large spin systems," Journal of Magnetic Resonance, vol. 208, pp. 179-194 (2011).

P. Krantz, M. Kjaergaard, F. Yan, T. P. Orlando, S. Gustavsson, and W. D. Oliver, "A quantum engineer's guide to superconducting qubits," Applied Physics Reviews 6, 021318 (2019), pp. 1-59.

F. Arute, K. Arya, R. Babbush, D. Bacon, J. C. Bardin, R. Barends, R. Biswas, S. Boixo, F. G. Brandao, D. A. Buell, et al., "Quantum supremacy using a programmable superconducting processor", Nature 574, pp. 505-510, (2019).

Y. Sung, L. Ding, J. Braumuller, A. Vepsalainen, B. Kannan, M. Kjaergaard, A. Greene, G. O. Samach, C. McNally, D. Kim, et al., "Realization of High-Fidelity CZ and ZZ-Free iSWAP Gates with a Tunable Coupler", Physical Review X 11, 021058 (2021), pp. 1-32.

M. Gong, S. Wang, C. Zha, M.- C. Chen, H.-L. Huang, Y. Wu, Q. Zhu, Y. Zhao, S. Li, S. Guo, et al., "Quantum walks on a programmable two-dimensional 62-qubit superconducting processor", Science 372, pp. 948-952 (2021); https://arxiv.org/abs/2102.02573.

P. Jurcevic, A. Javadi-Abhari, L. S. Bishop, I. Lauer, D. F. Bogorin, M. Brink, L. Capelluto, O. Gunluk, T. Itoko, N. Kanazawa, et al., "Demonstration of quantum vol. 64 on a superconducting quantum computing system", IOP Publishing, Quantum Science and Technology vol. 6, No. 2, 025020 (2021), pp. 1-11.

Y. Lu, S. Chakram, N. Leung, N. Earnest, R. K. Naik, Z. Huang, p. Groszkowski, E. Kapit, J. Koch, and D. I. Schuster, "Universal Stabilization of a Parametrically Coupled Qubit", Physical Review Letters 119, 150502 (2017), pp. 1-17.

N. Didier, E. A. Sete, J. Combes, and M. P. da Silva, "AC Flux Sweet Spots in Parametrically Modulated Superconducting Qubits," Physical Review Applied 12, 054015 (2019); arxiv.org/abs/1807.01310, pp. 1-11.

A. Petrescu, C. L. Calonnec, C. Leroux, A. Di Paolo, P. Mundada, S. Sussman, A. Vrajitoarea, A. A. Houck, and A. Blais, "Accurate methods for the analysis of strong-drive effects in parametric gates", arXiv preprint arXiv:2107.02343 (2021), pp. 1-20.

S. L. Braunstein and C. M. Caves, "Statistical distance and the geometry of quantum states", Physical Review Letters vol. 72, issued 22, pp. 3439-3443, (1994 American Physical Society).

S. Pang and N. Jordan, "Optimal adaptive control for quantum metrology with time-dependent Hamiltonians", Nature Communications 8, Article No. 14695, (2017), pp. 1-9.

S. Schmitt, T. Gefen, D. Louzon, C. Osterkamp, N. Staudenmaier, J. Lang, M. Markham, A. Retzker, L. P. McGuinness, and F. Jelezko, "Optimal frequency measurements with quantum probes", npj Quantum Information 7, Article 55, pp. 1-8 (2021).

T. Gefen, F. Jelezko, and A. Retzker, "Control methods for improved Fisher information with quantum sensing", Physical Review A 96, 032310 (2017), arxiv.org/pdf/1702.07408.pdf, pp. 1-7.

P. Klukowski, M. J. Walczak, A. Gonczarek, J. Boudet, and G. Wider, "Computer vision-based automated peak picking applied to protein NMR spectra", Bioinformatics, vol. 31, Issue 18, Sep. 15, 2015, pp. 2981-2988.

P. Klukowski, M. Augoff, M. Zieba, M. Drwal, A. Gonczarek, and M. J. Walczak, "NMRNet: a deep learning approach to automated peak picking of protein NMR spectra", Bioinformatics, vol. 34, Issue 15, Aug. 1, 2018, pp. 2590-2597.

G. Waldherr, J. Beck, P. Neumann, R. Said, M. Nitsche, M. Markham, D. Twitchen, J. Twamley, F. Jelezko, and J. Wrachtrup, "High-dynamic-range magnetometry with a single nuclear spin in diamond", Nature nanotechnology 7, 105 (2011), pp. 1-4.

\* cited by examiner

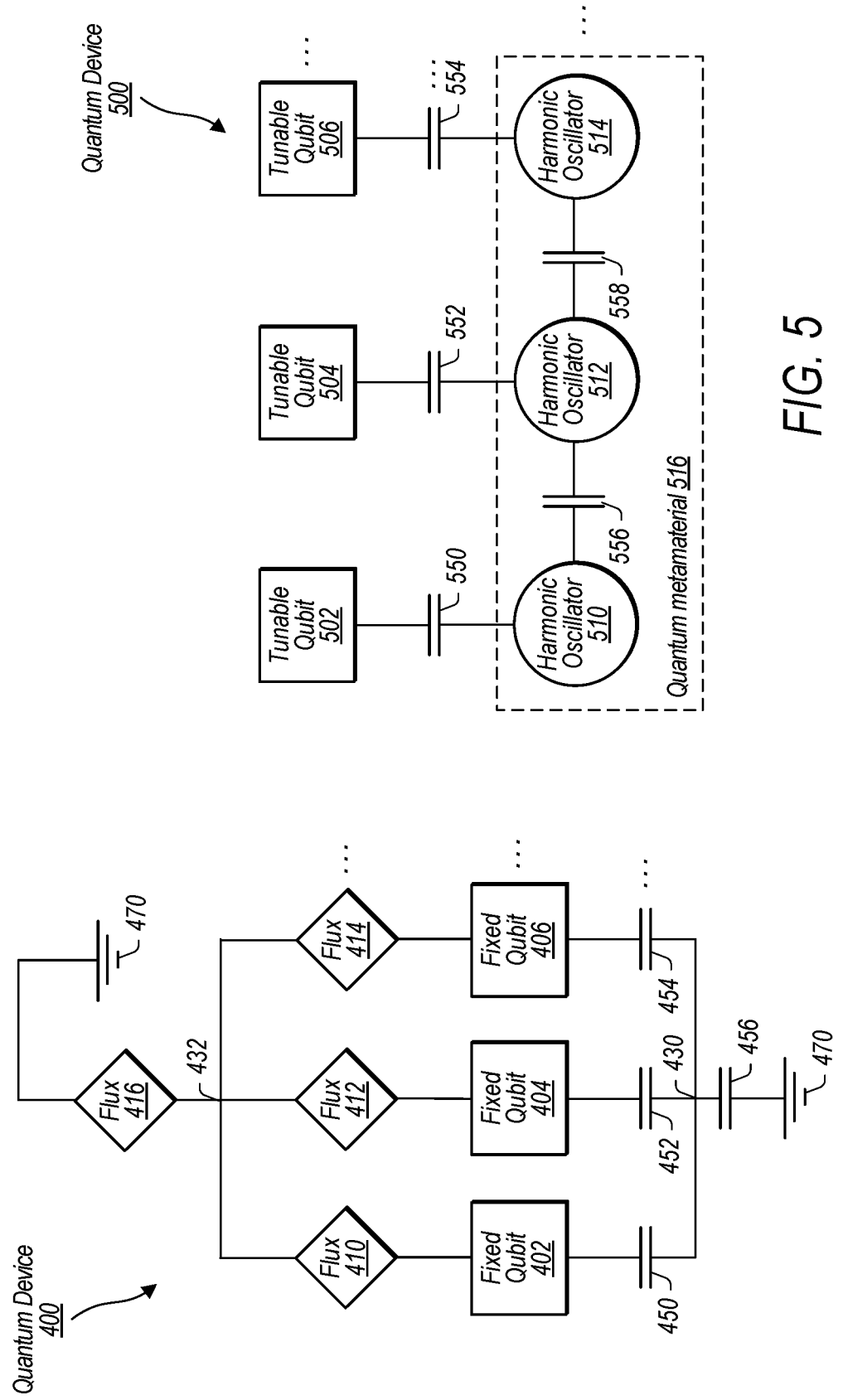

DETERMINATION OF CHARACTERISTICS OF A MOLECULE BY CONTROLLING COUPLING STRENGTHS BETWEEN QUBITS OF A QUANTUM DEVICE DURING A SERIES OF MEASUREMENTS

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects (e.g., particles) like photons, molecules, atoms, and electrons.

Quantum hardware utilizes quantum mechanics to allow one to write, store, process and read out information encoded in quantum states, e.g., the states of quantum objects. A quantum object is a physical object that behaves according to the laws of quantum physics. The state of a physical object is a description of the object at a given time.

In quantum mechanics, the state of a two-level quantum system, or simply, a qubit, is a list of two complex numbers, where the absolute sum of the complex numbers must sum to one. Each of the two numbers is called an amplitude, or quasi-probability. The square of an amplitude gives a potentially negative probability. Hence, each of the two numbers correspond to the square root that event zero and event one will happen, respectively. A fundamental and counterintuitive difference between a probabilistic bit (e.g., a traditional zero or one bit) and the qubit is that a probabilistic bit represents a lack of information about a two-level classical system, while a qubit contains maximal information about a two-level quantum system.

Quantum computers implemented using quantum hardware are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

There are different types of qubits that may be used in quantum computers, each having different advantages and disadvantages. For example, some quantum computers may include qubits built from superconductors, trapped ions, semiconductors, photonics, etc. Each may experience different levels of interference, errors and decoherence. Also, some may be more useful for generating particular types of quantum circuits or quantum algorithms, while others may be more useful for generating other types of quantum circuits or quantum algorithms.

BRIEF DESCRIPTION OF THE DRAWINGS

FIG. 4 illustrates a third example of a quantum device, implemented on quantum hardware, comprising qubits coupled to respective superconducting quantum interference devices (SQUIDs), according to some embodiments.

FIG. 5 illustrates a fourth example of a quantum device, implemented on quantum hardware, comprising qubits coupled to respective harmonic oscillators, according to some embodiments.

Figure 1:
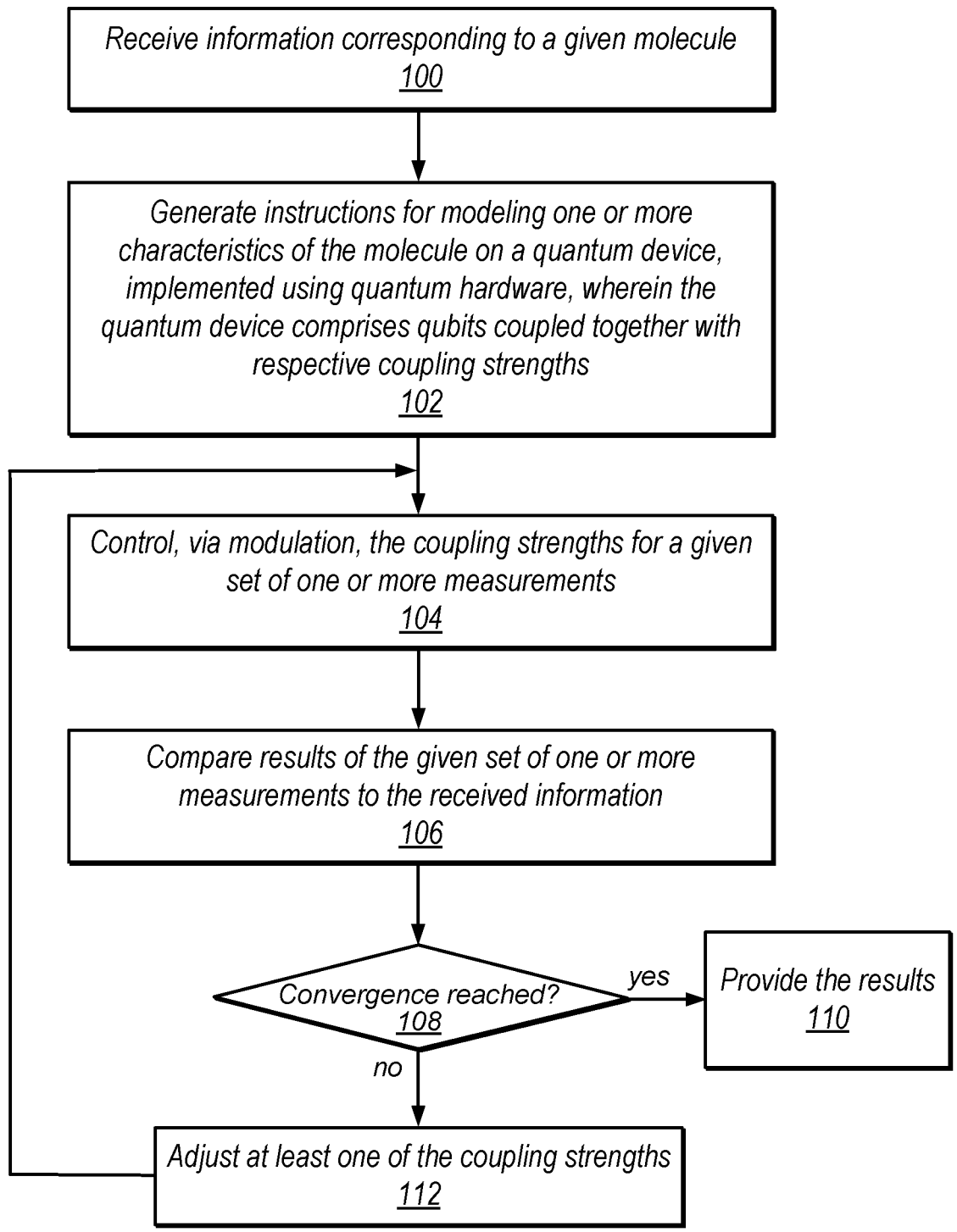
FIG. 1 is a flowchart illustrating a process of representing coupling strengths between atomic nuclei of a molecule using a quantum device implemented on quantum hardware, and drawing conclusions about said coupling strengths between the atomic nuclei based on tuning coupling strengths between qubits of the quantum device, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and systems for implementing a quantum device, using quantum hardware, to simulate one or more characteristics of a given molecule for molecular structure determination. Within the field of molecular structure determination, nuclear magnetic resonance (NMR) may be used as an experimental technique for determining such properties. Nuclear magnetic resonance spectroscopy may be used to identify frequencies associated with the weak inter-molecular interactions within a given molecule. By measuring these interactions, details of the molecular structure may be recovered. For example, an experimentally-measured nuclear magnetic resonance spectrum of a given molecule may be used to deduce J-coupling values, also known as the coupling between atomic nuclei of a given molecule that is mediated by their orbital electrons. Such J-coupling values may be then used to recover the molecular structure of the given molecule.

In some embodiments, in order to recover the molecular structure, quantum molecular dynamics may be simulated in order to solve a non-linear regression problem between the J-coupling values and the nuclear magnetic resonance spectrum. However, for molecules that may exhibit strong coupling and a requirement for long coherence times, such a simulation may become intractable. For example, when applying this technique to highly correlated systems, performing such a simulation may be a difficult task for classical computers using current classical computing simulation methods. In such cases, it may be advantageous to apply quantum devices that simulate such weak inter-molecular interactions within a given molecule that may be used to facilitate these studies. Such quantum devices, also referred to herein as quantum analog devices or quantum simulators, may allow for a more direct simulation and measurement of these interactions, and allow for the exploration of molecular structures of new molecules (e.g., as a prediction model). In some embodiments, quantum devices may not be limited by NMR-active elements, giving these embodiments and techniques a simulation advantage.

Methods for implementing and conducting one or more iterative measurements on a quantum device in order to draw conclusions about one or more characteristics of a molecule, such as J-coupling values, are described herein. In some embodiments, the quantum device is able to simulate J-coupling by repeatedly rotating qubits comprised within the quantum device. Alternatively, the quantum device may not repeatedly rotate the qubits but rather connect the qubits to tunable couplers (e.g., resonators, harmonic oscillators, anharmonic oscillators, etc.) in order to simulate J-coupling. Such embodiments are described in FIGS. 2, 3, 4, and 5 herein.

In some embodiments, nuclear magnetic resonance spectroscopy may be used to measure a magnetic field generated by magnetic dipoles of atomic nuclei of a molecule. Nuclear spins of said nuclei may be initialized to be not directly parallel to the magnetic field, after which the nuclei may rotate freely. Some of these rotations are generated by the scalar weak interaction between the different nuclei, called J-coupling, characterized by the Hamiltonian of the form $$H_{ij} = \frac{J_{ij}}{2}\sigma^{(i)} \cdot \sigma^{(i)} = \frac{J_{ij}}{2}(\sigma_x^{(i)}\sigma_x^{(j)} + \sigma_y^{(i)}\sigma_y^{(j)} + \sigma_z^{(i)}\sigma_z^{(j)}),$$

where σ is the Pauli operator vector. In some embodiments, for a given molecule the nuclear spins may be polarized, and may then evolve according to $H=\Sigma_{i<j}H_{ij}$.

Due to the inherent magnetic moments of the atomic nuclei, the rotating nuclei may create an oscillating magnetic field. When this field is projected on a particular axis (e.g., the z axis), it may be described by the operator $$B(t) = \sum_i \gamma_i \sigma_z^{(i)}.$$

In some embodiments, B(t) may be measured weakly, with negligible back action, allowing the approximation (B(t)), probed as a function of time, to be made. The simulation of the Hamiltonian H, and the measurement of B(t) may then be used to extract a J-coupling matrix (e.g., coupling matrix $J_{ij}$) through non-linear regression. Coupling matrix $J_{ij}$ may then be used to recover information regarding the molecular structure of a given molecule. In some embodiments, the solution of B(t) may require the solving of a Schrodinger equation for a set of N qubits. Such embodiments are described herein for FIGS. 2, 3, 4, and 5.

FIG. 1 is a flowchart illustrating a process of representing coupling strengths between atomic nuclei of a molecule using a quantum device implemented on quantum hardware, and drawing conclusions about said coupling strengths between the atomic nuclei based on tuning coupling strengths between qubits of the quantum device, according to some embodiments.

Figure 6:
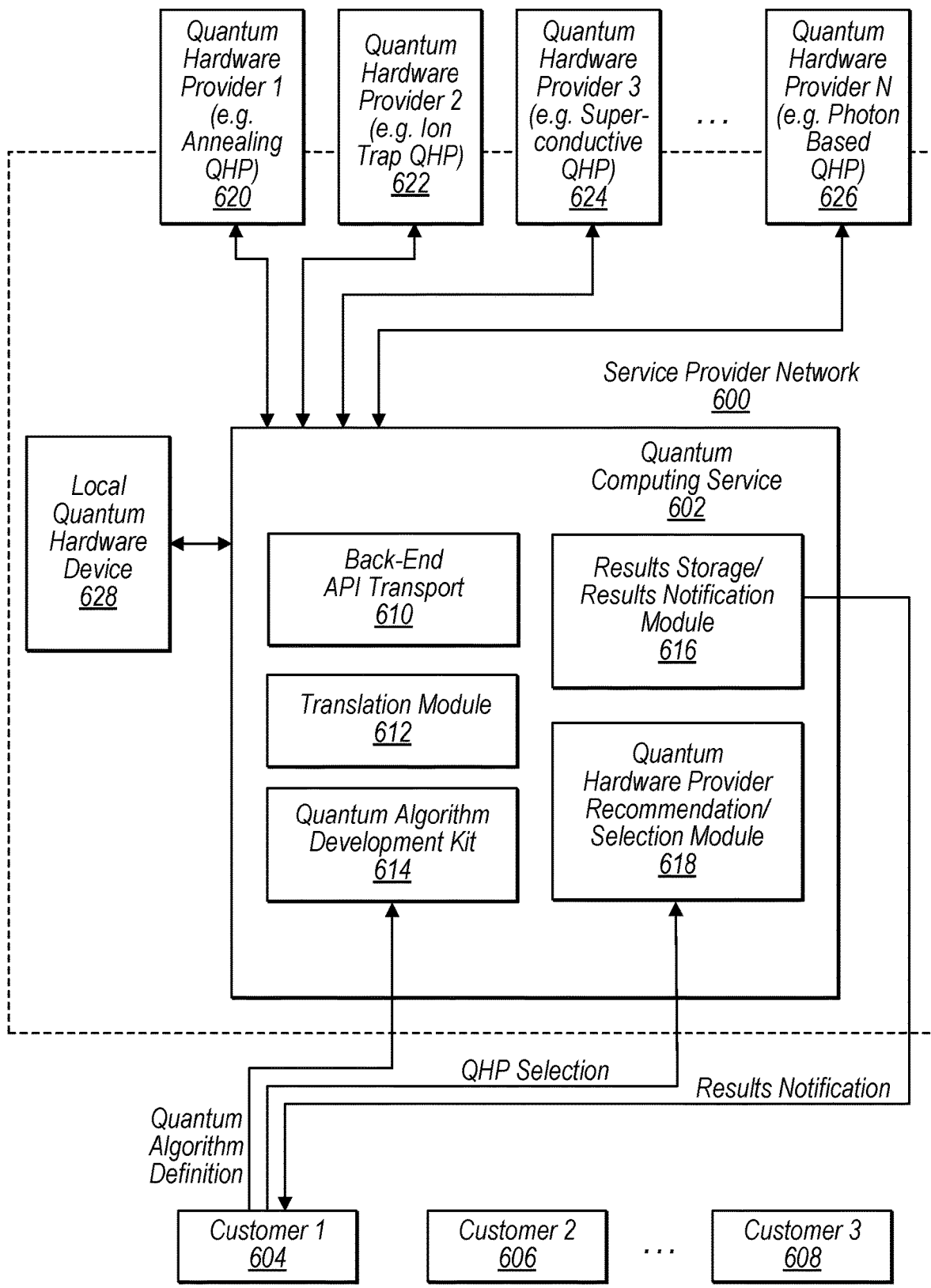
FIG. 6 illustrates a quantum computing service of a service provider network that enables customers to access quantum devices and computers that use multiple quantum computing technologies, according to some embodiments.
Figure 7:
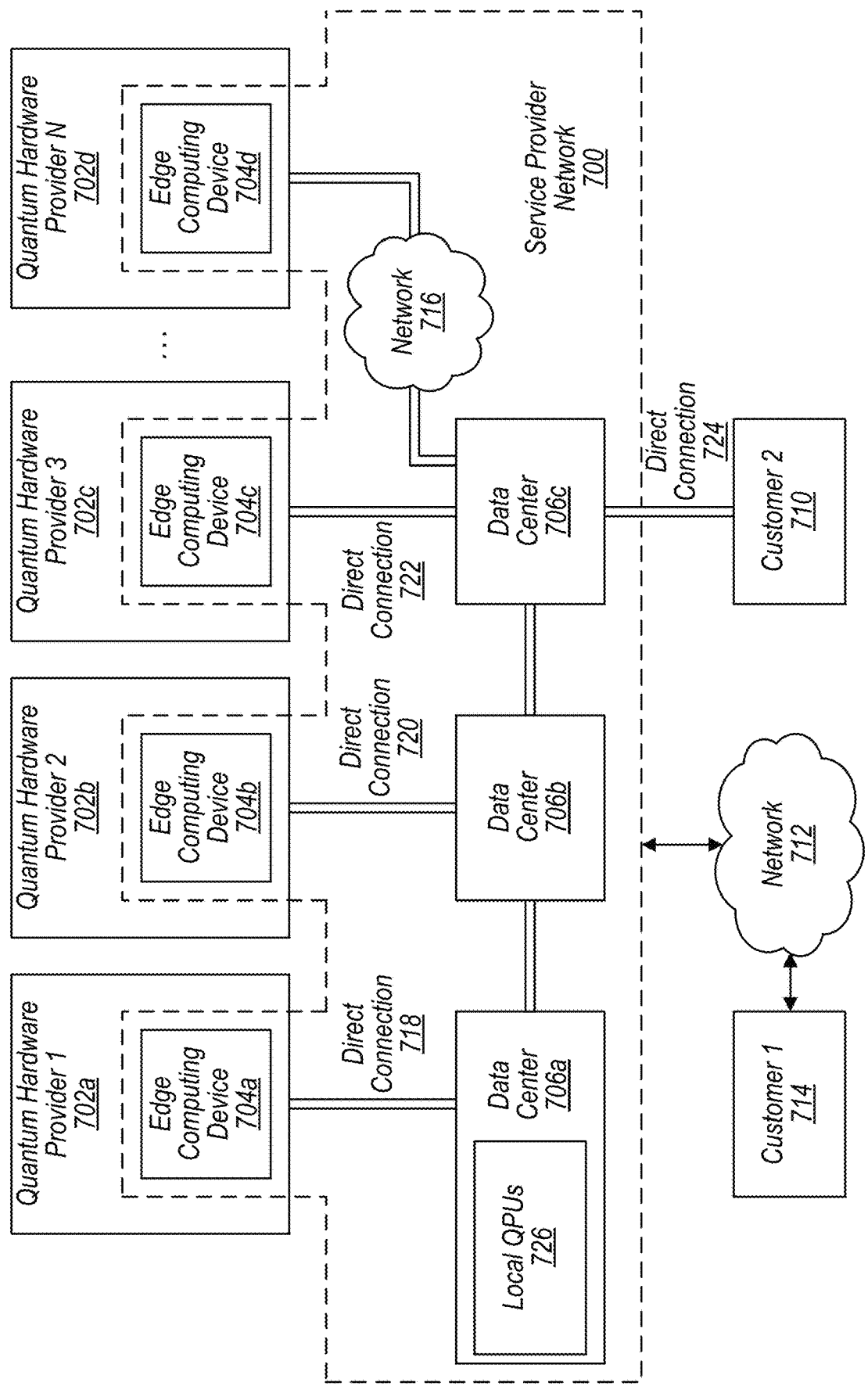
FIG. 7 illustrates an implementation of the service provider network in which customers and quantum hardware providers are connected to the service provider network via direct connections and/or network connections, according to some embodiments.
Figure 8:
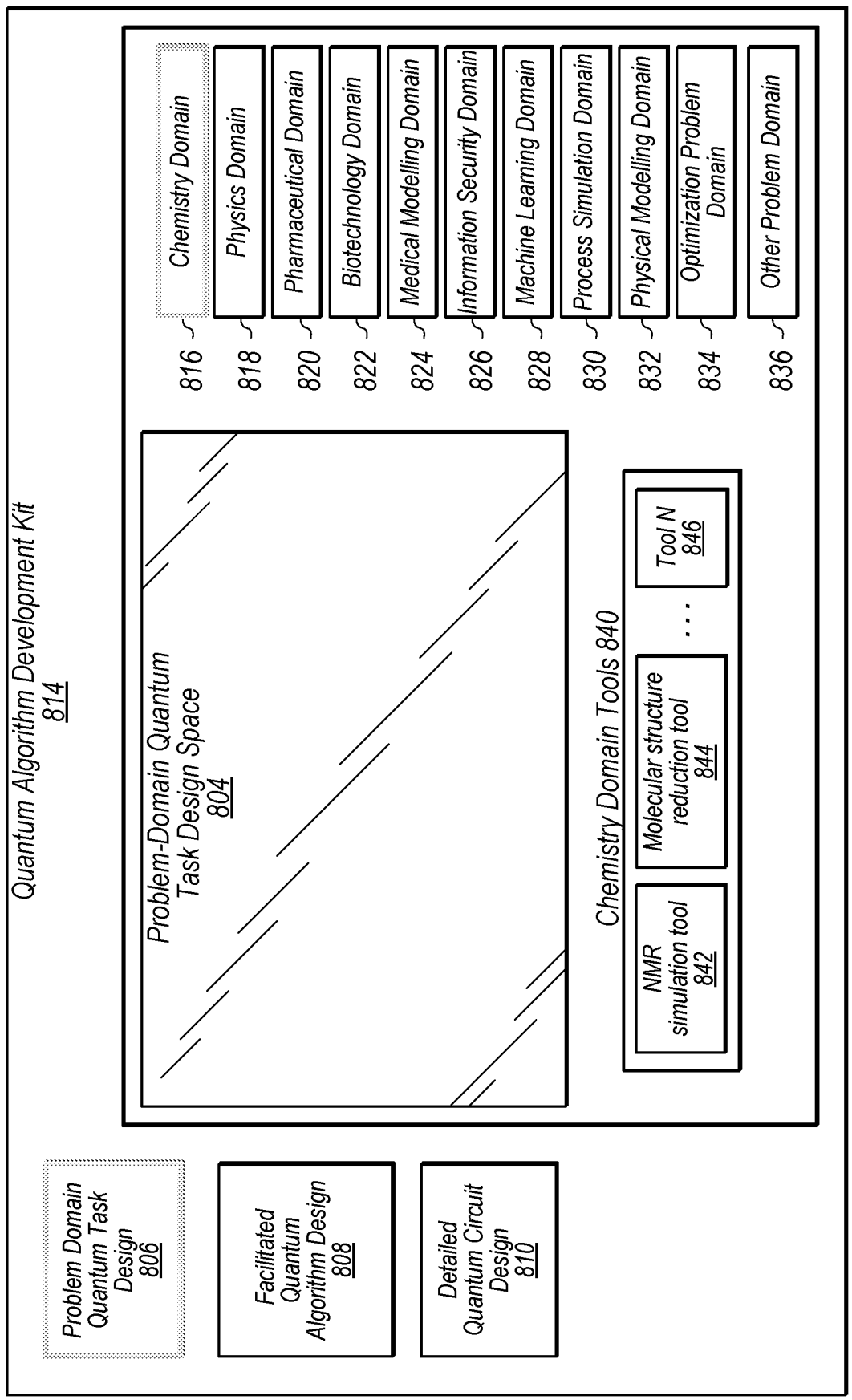
FIG. 8 illustrates an example quantum computing service quantum algorithm development kit interface, according to some embodiments.

In block 100, information corresponding to a given molecule is received. For example a user of a quantum computing service as shown in FIGS. 6-8 may provide the information corresponding to the given molecule to the quantum computing service and the quantum computing service may use the received information and the techniques described herein to model one or more characteristics of the molecule and provide the user with information about the one or more characteristics of the molecule, such as J-coupling strengths. In some embodiments, such information may comprise an experimentally-measured nuclear magnetic resonance spectrum (e.g., in the form of a frequency spectrum in which details about atomic interactions, coupling strengths, molecular structure, etc. may be decerned within one or more regions of interest of the given frequency spectrum) for the given molecule. In such embodiments, the information may additionally comprise some details about the molecular structure of the molecule, which may, at least in part, be used to determine the number of qubits that are required to represent the atomic nuclei of the molecule, according to some embodiments. The number of qubits may represent a subset of the total atomic nuclei in the molecule, and this may be considered to be the interacting atomic nuclei of interest, according to some embodiments. A kind of mapping may then exist between a quantum code space for a given qubit and the two possible states of a given nuclear spin for the nuclear spins of the interacting set of atomic nuclei.

In block 102, instructions for modeling one or more characteristics of the molecule using quantum hardware are generated and are used to implement a quantum device using the quantum hardware. For example, a quantum computing service may determine the instructions for modeling the one or more characteristics of the molecule based on the information about the molecule received from the user or other information about a type of molecule, that the molecule belongs to, that was previously provided to the quantum computing service or otherwise made available to the quantum computing service. The quantum device implemented using the quantum hardware to model characteristics of the molecule may comprise two or more qubits and a combination of capacitors, tunable couplers, superconducting quantum interference devices (SQUIDs), and/or harmonic oscillators. As described for block 100, the instructions may be based on the received information, and may comprise instructions such as the number of qubits to reserve on the quantum hardware and initialization parameters of the components of the quantum device. The one or more characteristics of the molecule may comprise a simulation of J-coupling. The generated instructions may additionally indicate a type of geometry (e.g., star-type, waveguide-type) for the quantum device that is to be used to carry out the instructions. For example, the generated instructions may indicate a type of quantum hardware that is to be used to model the one or more characteristics of the molecule. Also, the generated instructions may further include instructions for implementing a quantum device using the selected type of quantum hardware.

In some embodiments, a quantum device with a "star-type" geometry may be used to implement a direct "all-to-all" coupling of qubits (e.g., direct "all-to-all" coupling in which the qubits are connected to a single and/or common connection point). In an "all-to-all" coupling scenario, "all" of the qubits of the quantum device being used to simulate the one or more characteristics of the molecule (e.g., J-coupling) are coupled to "all" of the other qubits of the quantum device via a common connection point, such as common connection point 230 shown in FIG. 2. In some embodiments, a quantum device with a "waveguide-type" geometry may be used to implement an effective "all-to-all" coupling of qubits. In an effective "all-to-all" coupling scenario, the qubits of the quantum device being used to simulate the one or more characteristics of the molecule are connected via one or more tunable couplers, such as harmonic oscillators. Such variations in type of geometry are discussed for FIGS. 2, 3, 4, and 5 herein. FIGS. 2, 3, 4, and 5 also provide examples of the use of superconducting qubits, such as transmons, for implementations of various embodiments of the quantum device. However, other styles and types of qubits (bosonic qubits, cat qubits, etc.) may be used if considered advantageous for the particular characteristics of a given molecule.

In some embodiments, blocks 104, 106, 108, and 112 may represent an iterative process that may be used to converge respective modulated coupling strengths of the qubits to agreement with the one or more characteristics of the molecule described by block 102. In some embodiments, control of the coupling strengths of the qubits may refer to the control of certain properties of the qubits (e.g., the modulation of operating frequencies and/or energy gaps) during the given set of one or more measurements described in block 104. The qubit properties may be controlled such that these properties are changed with respect from one measurement to the next. In some embodiments, the control of such qubit properties are detailed in the generated instructions, as described in block 102.

As described above in regards to block 100, a given characteristic of the one or more characteristics to be determined may be to deduce J-coupling values from the controlling of said coupling strengths during the series of measurements, which may be provided with the results at block 110. In some embodiments, the received information, such as the experimentally-measured nuclear magnetic resonance spectrum, may be used to determine the one or more characteristics that may be deduced. Additionally, blocks 104, 106, 108, 110, and 112 may resemble the sequence shown in FIG. 9.

Figure 10:
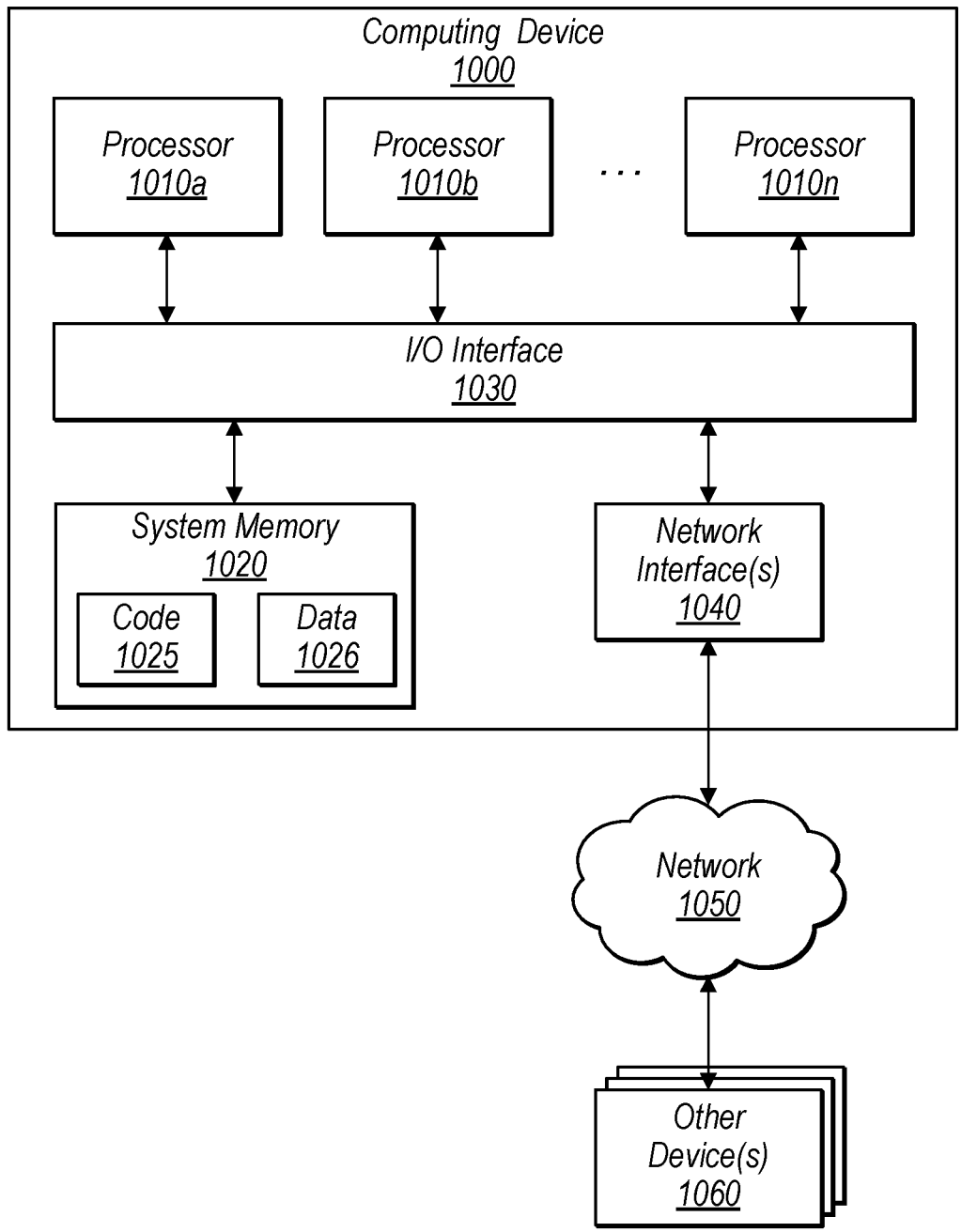
FIG. 10 is a block diagram illustrating an example classical computing device that may be used in at least some embodiments.

In some embodiments, the respective coupling strengths between qubits may be controlled via modulation with time during a given set of one or more measurements in block 104. During a first iteration, the initial respective coupling strengths may be parameters and/or properties that the qubits and other components of the quantum device are initialized to based on the received information about the molecule, prior to the beginning of the first measurement. However, subsequent to the first measurement, the respective coupling strengths may be controlled via modulation with one or more adjusted parameters and/or properties. In some embodiments, one or more classical computing devices (as shown in FIG. 10) may be used to determine the controls for the given measurement and may be in communication with the quantum hardware implementing the quantum device to direct the controls of the respective coupling strengths and the subsequent measurements. In some embodiments, this may comprise multiple iterations of coupling strength controls and subsequent measurements.

In block 106, the results of the first iteration of measurements (or subsequent measurement results for subsequent iterations) are compared to the received information discussed in block 100. In some embodiments, measurement results undergo post-processing in order to compare output signal(s) of the quantum device to the received information, such as the experimentally-measured nuclear magnetic resonance spectrum for the given molecule. For example, in some embodiments in which the given quantum device comprises transmons implemented onto quantum hardware, error-correcting code procedures may be used to decode results from the quantum device (e.g., a mean value may be estimated from readouts from respective transmons on the quantum device). Such embodiments may compare time-dependent signals in order to complete error-correcting code procedures.

In some embodiments, in addition to, or instead of, comparing time-dependent signals, operating frequencies of the qubits (e.g. transmons) may be compared to the received information, such as a portion of the nuclear magnetic resonance spectrum for the molecule of interest. For example, such operating frequencies may be detected from a "single shot" transmon readout, and then compared to a given frequency range (or region of interest within the total frequency spectrum provided) of the experimentally-measured nuclear magnetic resonance spectrum. The optimization of such a readout may rely on quantum sensing results (e.g., broadband techniques) and on frequency calculations made with quantum probes, in addition to the leverage of efficient frequency calculation methods both for quantum and classical time-dependent signals. In some embodiments, a first stage of such methods may comprise the use of broadband techniques and a second stage may comprise a calculation of the quantum Fisher Information.

The calculation of the Fisher Information may be made using a density matrix of one Two-Level States (TLS), $1+r\sigma_\phi$, in which r may be defined as the contrast, and the quantum Fisher Information may be defined as $$I = r^2 \left( \frac{d\phi}{d\omega_i} \right)^2.$$

As such, the quantum Fisher Information per one frequency may be proportional to $T_1^4$, where the proportional coefficient is the square of the contrast of the frequency. In some embodiments, approximately 100 shots per frequency may reach current precision limits of state-of-the-art NMR techniques (e.g., on the order of 10 mHz), and, for reference for the embodiments described herein, J-coupling may be found on the order of the 10 Hz range within a given NMR spectrum.

After comparing said post-processed results to the received information, a check for convergence to the one or more characteristics is made in block 108 (as mentioned above, the steps shown in blocks 104 through 112 may be performed iteratively). If convergence has indeed been made, the results of the first iteration of measurements (or the current iteration) are provided in block 110. If convergence has not been made after the first iteration (or current iteration), then adjustments may be made to one or more coupling strengths within the quantum device in block 112 in preparation for a second (or subsequent) iteration of measurements. Such adjustments may comprise different initialization parameters for one or more components of the quantum device prior to the beginning of the second (or subsequent) iteration of measurements with respect to the previous measurement(s). In some embodiments, the process described by blocks 104, 106, 108, and 112 may be repeated until convergence is reached and the iterated results are provided in block 110.

In some embodiments, the process described in FIG. 1 may be implemented as part of a quantum computing service, which is described by FIGS. 6, 7, 8, and 9. In such embodiments, the information described in block 100 may have been generated on behalf of a customer of the quantum computing service, and is then received via an interface of the quantum computing service. In such embodiments, results about the information and/or characteristics of the given molecule may be provided, in block 110, to the customer of the quantum computing service.

Figure 2:
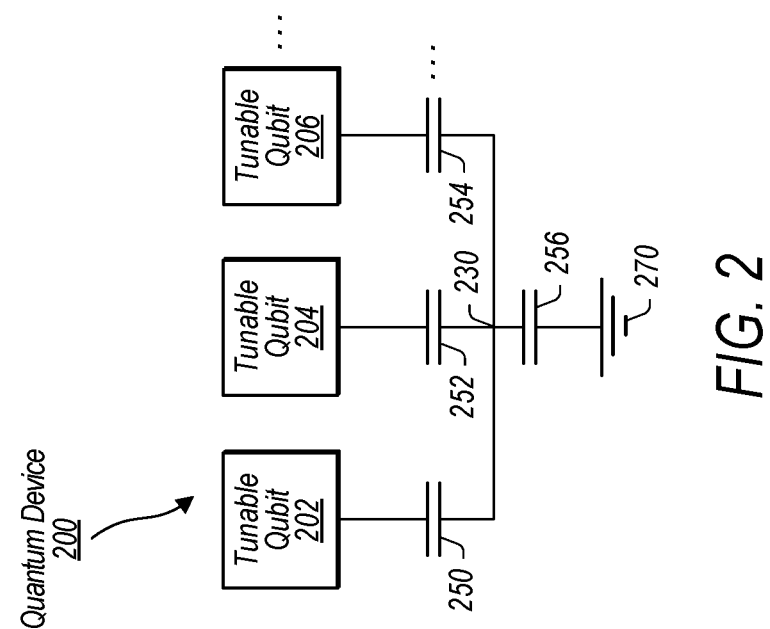
FIG. 2 illustrates an example of a quantum device, implemented on quantum hardware, comprising capacitively coupled qubits, according to some embodiments.

FIG. 2 illustrates an example of a quantum device, implemented on quantum hardware, comprising capacitively coupled qubits, according to some embodiments.

In some embodiments, quantum device 200 may be implemented using quantum hardware in order to simulate one or more characteristics of a given molecule. Quantum device 200 may also be referred to as an analog quantum device or an analog simulator, according to some embodiments. Quantum device 200 comprises tunable qubits, such as tunable qubits 202, 204, and 206, that may be respectively connected to capacitors, such as capacitors 250, 252, and 254, which have a capacitance of $C_g$, according to some embodiments. In some embodiments, tunable qubits 202, 204, and 206 may be superconducting qubits, such as transmons, which may have applicability to single qubit and two-qubit gates. In the embodiments shown in FIG. 2, tunable qubits 202, 204, and 206 are referred to as "tunable" due to the tunable nature of their respective energy gaps, which is further explained by the following paragraphs herein. In some embodiments, in which the above described techniques are implemented using a quantum computing service, the quantum computing service may provide access to a quantum hardware provider (QHP), such as a QHP with quantum hardware that comprises superconducting qubits that may be used to implement quantum device 200 as shown in FIG. 2. Also, a quantum computing service may include internal quantum hardware, which may comprise superconducting qubits, that may be used to implement quantum device 200 as shown in FIG. 2.

In embodiments represented by quantum device 200, tunable qubits 202, 204, and 206 are connected, via capacitors 250, 252, and 254, respectively, to capacitor 256, which is also connected to ground (e.g., electrical ground) 270. This common connection point is represented by label 230, as shown in FIG. 2. In some embodiments, capacitor 256 may be referred to as the coupling capacitor with capacitance $C_g$. This arrangement of qubits, such as tunable qubits 202, 204, and 206, that are connected to a single capacitor may be referred to as a "star" geometry, according to some embodiments. The star-type geometry may refer to the connection of the tunable qubits to a common point, such as shown by label 230, which may establish a direct "all-to-all" coupling between the qubits.

In some embodiments, for example as shown in FIG. 2, there are three tunable qubits connected to point 230. However, it should be understood by a person with ordinary skill in the art that a given number of qubits (e.g., N) may be used to implement a given version of quantum device 200 according to the molecule and/or class of molecules being represented by quantum device 200. Additional star-type geometry embodiments are discussed herein, such as for FIGS. 3 and 4.

In some embodiments, the tunable qubits 202, 204, and 206 may be referred to as "tunable" since their respective energy gaps may be controlled via modulation and/or varied with time. During such an interaction, the respective energy gaps of the tunable qubits 202, 204, and 206, denoted as $\Delta^{(i)}(t)$, are modulated. For example, given an arrangement of the tunable qubits according to a star-type geometry such as shown by quantum device 200, the respective capacitances of tunable qubits 202, 204, and 206 may be denoted as C. Given that the number of tunable qubits is represented by a number N, the following coupling interaction may result:

$$\frac{2C_g}{NC^2}\hat{Q}^{(i)}\hat{Q}^{(j)},$$

where $\hat{Q}^{(i)}$ is the tunable qubit charge (e.g., momentum) operator for a given tunable qubit i within quantum device 200. The effective coupling between respective qubits may then be proportional to $C_g/(NC^2)$, which may be controlled by modulating energy gaps of the respective tunable qubits, according to some embodiments. In some embodiments, tunable qubits 202, 204, and 206 may represent the "tunable elements" that enable control of the coupling strengths between qubits in quantum device 200. In some embodiments of some of the other quantum devices described herein, the qubits of the given quantum device may be fixed, and other components of the quantum device (e.g., tunable couplers, superconducting quantum interference devices, etc.) may represent the "tunable" elements that enable control of the coupling strengths between qubits of the given quantum device.

In embodiments in which the tunable qubits implemented using a star-type geometry shown in FIG. 2 have approximately the same energy gap $\Delta^{(i)}(t)$, this may result in the following Hamiltonian:

$$H_{Star} = -\sum_{i=1}^{N}\Delta^{(i)}(t)\frac{\sigma_z^{(i)}}{2} + \sum_{i \neq j}g\sigma_+^{(i)}\sigma_-^{(j)},$$

where g is the effective coupling frequency, $\sigma_z^{(i)}$ is the Pauli z operators, and $\sigma_+^{(i)} = \sigma_-^{(i)\dagger} = |1\rangle\langle 0|$ for a given tunable qubit i within quantum device 200.

In some embodiments, the coupling strengths between respective pairs of tunable qubits shown in FIG. 2 may be equal. However, in other embodiments, one or more of the coupling strengths between respective pairs of the tunable qubits may be different from one another, and such embodiments are also described herein.

In some embodiments, by modulating $\Delta^{(i)}(t)$, the target effective interaction may be:

$$H_{eff} = \sum_{i \neq j} J_{ij} \sigma_+^{(i)} \sigma_-^{(j)} = \sum_{i<j} \frac{J_{ij}}{2} [\sigma_x^{(i)} \sigma_x^{(j)} + \sigma_y^{(i)} \sigma_y^{(j)}],$$

for some symmetric matrix $J=J_{ij}$. The effective Hamiltonian lacks the $\sigma_z^{(i)} \sigma_z^{(j)}$ term in the above equation for $H_{ij}$, which can be added using short rotation pulses, which is described below.

In some embodiments, in order to achieve the target effective interaction, the interaction picture (e.g., a change of basis, referring to an alternative representation of the system dynamics) may be moved with respect to the respective energy gaps of the tunable qubits shown in quantum device 200, which may be given by the transformation $$U = \exp\left(i \sum_{i=1}^{N} \int dt \Delta^{(i)}(t) \frac{-\sigma_z^{(i)}}{2}\right).$$

The Hamiltonian then becomes:

$$H_{int} = \sum_{i \neq j} g\left(\sigma_+^{(i)} \exp\left(i \int \Delta^{(i)}(t) dt\right)\right)\left(\sigma_-^{(j)} \exp\left(i \int \Delta^{(j)}(t) dt\right)\right).$$

In some embodiments, averaging over time with a good approximation, may be considered as setting every rotating term to zero. Thus, the effective interaction becomes:

$$H_{int} = \sum_{i \neq j} g\left\langle \exp\left(i \int \Delta^{(i)}(t) dt\right) \exp\left(i \int \Delta^{(j)}(t) dt\right)\right\rangle \sigma_+^{(i)} \sigma_-^{(j)} = \sum_{i \neq j} J_{ij} \sigma_+^{(i)} \sigma_-^{(j)},$$

where the bra-ket notation designates this averaging over time. Thus, the effective interaction may be related to the coupling matrix $J_{ij}$ via the selection of the appropriate $\Delta_i(t)$ functions.

This selection may be made within the context of the use of a star-type geometry for quantum device 200, according to some embodiments. This may be defined by the following Lagrangian function:

$$\mathcal{L} = \sum_{i=1}^{N} E_J^{(i)} \cos(\phi^{(i)}/\Phi_0) - \dot{\phi}^T \frac{C}{2} \dot{\phi},$$

where $\phi^{(i)}$ is the flux in the i'th tunable qubit, $\phi$ is a vector of fluxes, and C is the coupling matrix that describes the respective energies of the capacitors. To find C, the flux at point 230 in FIG. 2, (e.g., the common point) as $\phi_c$. From conservation of charge at point 230, $\Sigma Q^{(i)} = 0$, where $Q^{(i)}$ is the charge at the i'th coupling capacitor:

$$C_g(\dot{\phi}^{(i)} - \dot{\phi}_c) = C_g V^{(i)} = Q^{(i)}$$

Therefore, $$\sum_{i=1}^{N} C_g(\dot{\phi}^{(i)} - \dot{\phi}_c) = 0 \Rightarrow \dot{\phi}_c = \sum_i \frac{\dot{\phi}^{(i)}}{N}.$$

The energy on respective capacitors in quantum device 200 is then:

$$E^{(i)} = \frac{[Q^{(i)}]^2}{2 C_g} = \frac{C_g(\dot{\phi}^{(i)} - \dot{\phi}_c)^2}{2}.$$

The total coupling matrix C may then defined by the following energy term:

$$E = \sum_{i=1}^{N} \frac{C}{2}(\dot{\phi}^{(i)})^2 + \frac{C_g}{2}(\dot{\phi}^{(i)} - \dot{\phi}_c)^2 = \dot{\phi}^T \frac{C}{2} \dot{\phi},$$

where $$C = I_N\left(C + C_g \frac{N-1}{N}\right) - O C_g \frac{1}{N},$$

and where $I_N$ is the N dimensional identity matrix, and O is a matrix with ones at all non-diagonal elements (and zeros on the diagonal). The momenta (with index as $P^{(i)}$ and P as a vector) may then be defined as the following:

$$P^{(i)} = \frac{\partial \mathcal{L}}{\partial \dot{\phi}^{(i)}} C \dot{\phi}.$$

Thus, transformed into the Hamiltonian, $$\mathcal{H} = \frac{\partial \mathcal{L}}{\partial \dot{\phi}} \cdot P - \mathcal{L} = P^T \frac{C^{-1}}{2} P = \sum_i E_J^{(i)} \cos(\phi^{(i)}/\Phi_0).$$

Notice that the effective coupling between the tunable qubits may be defined by the off diagonal elements of the matrix $C^{-1}$. From the symmetry of the problem, equal effective coupling between the tunable qubits may be determined to be approximately equal to $$\frac{2 C_g}{C^2 N}.$$

However, embodiments in which one or more of the respective effective coupling(s) between the tunable qubits are different are also encompassed within the embodiments described herein.

Upon transforming the Hamiltonian for the star-type geometry into a ladder operator shape, a set of coupled Duffing oscillators may be obtained that have energy gaps $\Delta^{(i)}(t)$ that may be modulated with some symmetric coupling matrix $g_{ij}$:

$$H = \sum_i \Delta^{(i)}(t) b_{(i)}^\dagger b_{(i)} - \frac{\delta_{(i)}}{2} b_{(i)}^\dagger b_{(i)}^\dagger b_{(i)} b_{(i)} + \sum_{i,j} g_{ij} b_{(i)}^\dagger b_{(j)},$$

where $b^{(i)}$ is the lowering operator for the i'th tunable qubit in quantum device 200. In embodiments in which the coupling is weaker than the non-linearity $g_{ij} \ll \delta$, minor leakage to the second excited level may occur. In such embodiments, it may be advantageous to work in a two-level subspace (e.g. code space):

$$H = \sum_i \Delta^{(i)}(t) \frac{[-\sigma_z^{(i)}]}{2} + \sum_{i,j} g_{ij} \sigma_+^{(i)} \sigma_-^{(j)}.$$

It is now relevant to find a given N×M matrix K that obeys the following set of equations given a coupling matrix J:

$$\forall_{i \neq j} : \sum_m^M K_m^{(i)} K_m^{(j)} = J_{ij}/g_{ij},$$

$$\forall_{1 \leq i \leq N} : \sum_m^M K_m^{(i)} K_m^{(i)} = 1,$$

$$\forall_{i,k} : \sum_{m=1}^{M-k} K_m^{(i)} K_{m+k}^{(i)} = 0.$$

Accounting for any error introduced for the simulation, matrix K may be defined via the following:

$$\forall_i : \left| \sum_{m=1}^M K_m^{(i)} e^{im\omega t} \right|^2 = 1,$$

$$\forall_{i \neq j} : \sum_{m=1}^M K_m^{(i)} K_m^{(j)} = J_{ij}/g_{ij}.$$

Then, to make $\Delta^{(i)}(t)$ real, the following defining equation may be used:

$$\exp(i\int \Delta^{(i)}(t) dt) = \Sigma K_m^{(i)} e^{im\omega t},$$

which is then solved for a real $\Delta^{(i)}(t)$:

$$\Delta^{(i)}(t) = \text{Im}\left(\frac{d}{dt} \ln\left[\sum K_m^{(i)} e^{im\omega t}\right]\right) = \text{Re}\left(\frac{\sum \omega m K_m^{(i)} e^{im\omega t}}{\sum K_m^{(i)} e^{im\omega t}}\right).$$

Thus, in the interaction picture with respect to $$U = \exp\left(i \sum_{i=1}^N \int dt \Delta^{(i)}(t) \frac{-\sigma_z^{(i)}}{2}\right):$$

$$\sigma_+^{(i)} \to U \sigma_+^{(i)} U^\dagger = \sigma_+^{(i)} \exp(i \int dt \Delta^{(i)}(t)) = \sigma_+^{(i)} \Sigma K_m^{(i)} e^{im\omega t},$$

and $\sigma_-$ transforms in a similar manner.

The full Hamiltonian for a star-type geometry then becomes:

$$H_{int} = \sum_{i,j} g_{ij} \left(\sigma_+^{(i)} \sum_{n=1}^M K_n^{(i)} e^{in\omega t}\right)\left(\sigma_-^{(j)} \sum_{m=1}^M K_m^{(j)} e^{-im\omega t}\right),$$

and, after averaging any rotating terms to zero:

$$H_{int} = \sum_{i,j} \left(g_{ij} \sum_{n=1}^N K_n^{(i)} K_n^{(j)}\right) \sigma_+^{(i)} \sigma_-^{(j)} = \sum_{i,j} J_{ij} \sigma_+^{(i)} \sigma_-^{(j)}$$

This $H_{int}$ Hamiltonian may be used to generate the full J-coupling Hamiltonian by repeatedly pulsing the tunable qubits and rotating them around the Bloch sphere. For example, a π/2 rotation around the y axis, is effectively transforming the $\sigma_x^{(i)}\sigma_x^{(j)} + \sigma_y^{(i)}\sigma_y^{(j)}$ interactions into $\sigma_y^{(i)}\sigma_y^{(j)} + \sigma_z^{(i)}\sigma_z^{(j)}$. By repeatedly rotating the tunable qubits around a given axis, the Hamiltonian may be spherically symmetrized, and a Trotterized version of the $\sigma_x^{(i)}\sigma_x^{(j)} + \sigma_y^{(i)}\sigma_y^{(j)} + \sigma_z^{(i)}\sigma_z^{(j)}$ Hamiltonian may be formed. In some embodiments, to minimize the error generated by such a Trotterization, the Baker-Campbell-Hausdorff formula (up to second order) may be used for some general operators $O_i$:

$$e^{O_1} e^{O_2} e^{O_3} = e^{O_1 + O_2 + \frac{1}{2}[O_1, O_2]} e^{O_3} = e^{O_1 + O_2 + O_3 + \frac{1}{2}[O_1, O_2] + \frac{1}{2}[O_1, O_3] + \frac{1}{2}[O_2, O_3]},$$

The second order error may be represented by:

$$\text{error} = \sum_{i<j} [O_1, O_i].$$

Therefore, if the Trotterization sequence is symmetrized, the second order Trotterization error may be eliminated, according to some embodiments, through use of the following sequence:

$$\sigma_x^{(i)} + \sigma_x^{(j)} + \sigma_y^{(i)}\sigma_y^{(j)} \to \sigma_x^{(i)}\sigma_x^{(j)} + \sigma_z^{(i)}\sigma_z^{(j)} \to$$

$$\xrightarrow{\times 2} \sigma_y^{(i)}\sigma_y^{(j)} + \sigma_z^{(i)}\sigma_z^{(i)} \to \sigma_x^{(i)}\sigma_x^{(i)} + \sigma_z^{(i)}\sigma_z^{(i)} \to \sigma_x^{(i)}\sigma_x^{(i)} + \sigma_y^{(i)}\sigma_y^{(j)}$$

where the "x2" is used to indicate that the $\sigma_y^{(i)}\sigma_y^{(j)} + \sigma_z^{(i)}\sigma_z^{(j)}$ term may be active for twice as long as other terms. The following rotation sequence may be used to generate the above sequence:

$$X_{\pi/2}, Y_{\pi/2}, Y_{-\pi/2}, X_{-\pi/2},$$

where $X_\phi$, for example, denotes a rotation around the x axis with angle ϕ, and similarly for the y and z axes. In some embodiments, for some evolution of length T, if a single pulse sequence is of length δt, then the expected error in the evolution would scale as $$\delta t = \frac{T}{N},$$

with N being the number of pulse sequences. The trotter error due to the evolution may scale as $T\delta t^2 \propto N^{-2}$, according to some embodiments.

In some embodiments of quantum device 200 that use tunable qubits, it may be advantageous to protect against sensitivity of the tunable qubits to noise due to incoming flux, which may reduce their lifetimes, by adding a tone to a parametric drive and operating in a particular range.

Figure 3:
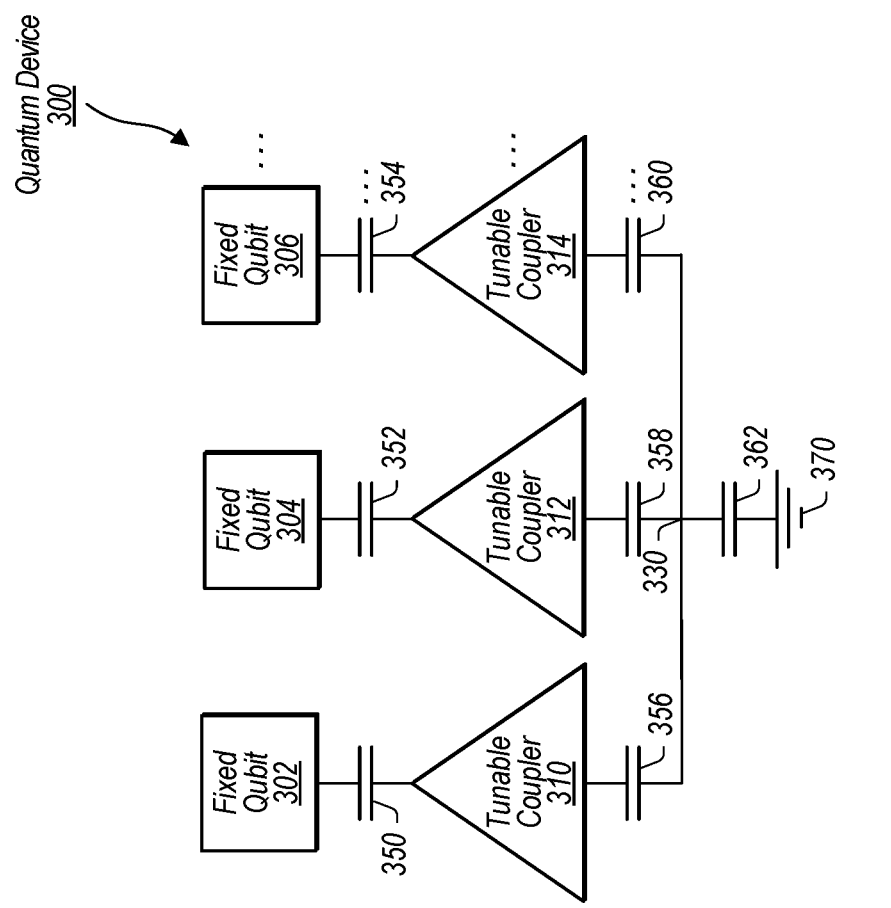
FIG. 3 illustrates a second example of a quantum device, implemented on quantum hardware, comprising qubits coupled to respective tunable couplers, according to some embodiments.

FIG. 3 illustrates a second example of a quantum device, implemented on quantum hardware, comprising qubits coupled to respective tunable couplers, according to some embodiments.

In some embodiments, quantum hardware may be used to implement quantum device 300 in order to simulate one or more characteristics of a given molecule. In some embodiments, quantum device 300 may represent a second implantation example for the given molecule represented by quantum device 200. However, quantum device 300 may also be used to represent a different molecule, either in the same or different class of molecules as the molecule described in FIG. 2.

In some embodiments in which it is advantageous to prolong the lifetime of the qubits in a given quantum device, fixed qubits, as opposed to tunable qubits, may alternatively be used. This may be achieved by connecting fixed qubits to respective independent and tunable harmonic oscillators and using a star-type geometry (see also the implementation using fixed qubits described for FIG. 4 herein). Quantum device 300 represents such an implementation of the star-type geometry in which fixed qubits 302, 304, and 306 are connected to common point 330 and capacitor 362, which is then connected to ground 370. Fixed qubits 302, 304, and 306 are connected to common point 330 via respective tunable couplers 310, 312, and 314, and respective capacitors 350 and 356, 352 and 358, and 354 and 360, therefore establishing a direct "all-to-all" coupling. Fixed qubits 302, 304, and 306 may be referred to as "fixed" since their respective energy gaps may not be tuned with time, as opposed to those of tunable qubits 202, 204, and 206, for example. In some embodiments, tunable couplers 310, 312, and 314 may represent the "tunable elements" that enable control of the coupling strengths between the fixed qubits in quantum device 300. In some embodiments, capacitors 350, 352, 354, 356, 358, and 360 have a capacitance of $C_g$. As discussed for FIG. 2 herein, fixed qubits 302, 304, and 306 may refer to superconducting qubits, and any number of N fixed qubits (and respective tunable couplers and capacitors) may be arranged in the configuration shown by quantum device 300.

In embodiments such as those shown in FIG. 3, it may be assumed that fixed qubits 302, 304, and 306 have the same fixed energy. By denoting the ladder operators of the i's tunable coupler as $c_i$, the following Hamiltonian may be written:

$$H = \sum_i \Delta^{(i)}(t) c_i^\dagger c_i + g(\sigma_+^{(i)} c_i + h.c.) + \sum_{i,j} J(c_i^\dagger c_j + h.c),$$

where g is the coupling between a respective fixed qubit and tunable coupler, and J is the coupling between respective pairs of tunable couplers. As opposed to modulating the energy gaps of respective tunable qubits, such as described for FIG. 2, the energy gaps of the respective tunable couplers, $\Delta^{(i)}(t)$, may be modulated in the following way:

$$\exp\left(-i \int dt \Delta^{(i)}(t)\right) = e^{i\Delta t} \sum_{n=-M/2}^{M/2} K_n^{(i)} e^{i 2n \Delta t},$$

where $\Delta$ represents the distance between a given tunable coupler's sideband and a respective fixed qubit. In some embodiments, since the interaction between the tunable qubits is a third order effect, the effective average coupling may have the following form:

$$J_{ij} = \sum_{n,m} K_n^{(i)} K_m^{(j)} \frac{g^2 J}{\Delta^2} \frac{1}{1+2n} \frac{1}{1+2m}.$$

In order to derive the effective coupling between a given pair of fixed qubits in quantum device 300, the following Hamiltonian may be used, in which the given pair of fixed qubits are connected through respective tunable couplers that operate at two different frequencies:

$$H = \sum_{i \in \{1,2\}} \Delta_i c_i^\dagger c_i + \sum_{i \in \{1,2\}} g_i c_i^\dagger \sigma_+^{(i)} + J c_1^\dagger c_2 + h.c.$$

where $c_i$ represents a given tunable coupler's ladder operators, and $\sigma_+^{(i)}$ represents the respective connected fixed qubit's ladder operators. It may be noted that the respective fixed qubit may have second order frequency shifts due to the effective coupling with the tunable couplers. The direct coupling between the two fixed qubits (via connection to the respective tunable couplers) may be analyzed by looking at the energy shift of the two states $$|+\rangle = \frac{\sigma_+^{(1)} \sigma_+^{(2)}}{\sqrt{2}} |0\rangle$$

of the given mapped code space.

In embodiments in which said coupling may be treated as a perturbation to the Hamiltonian, $$V = \sum_{i \in \{1,2\}} g_i c_i^\dagger \sigma_+^{(i)} + J c_1^\dagger c_2 + h.c.$$

In embodiments in which the tunable couplers are detuned from the fixed qubits, the eigenstate may approximately remain in the qubit code space. An evaluation of the correction to the energy of the eigenstates $|\pm\rangle$ may take place, which may give the following effective coupling between the two respective fixed qubits:

$$\sum_{i,j \in \{1,2\}} \frac{\langle \pm | V | c_i \rangle \langle c_i | V | c_j \rangle \langle c_j | V | \pm \rangle}{\Delta_i \Delta_j} = \pm \frac{g_1 g_2 J}{\Delta_1 \Delta_2}$$

where $|c_i\rangle \geq c_i^\dagger |0\rangle$. This shift may be interpreted as an effective coupling between the two fixed qubits with amplitude $$g_{eff} = \frac{g_1 g_2 J}{\Delta_1 \Delta_2}.$$

There may be a stronger second order effect, defined by the shift of the two fixed qubits due to their coupling to their respective tunable couplers. In some embodiments of quantum device 300, the oscillation of the tunable couplers may be optimized in order to match the energy gaps (e.g., frequencies) of the fixed qubits.

FIG. 4 illustrates a third example of a quantum device, implemented on quantum hardware, comprising qubits coupled to respective superconducting quantum interference devices (SQUIDs), according to some embodiments.

Quantum device 400 represents a third implementation of a quantum device with a star-type geometry. In this implementation, however, fixed qubits are connected both to a common point via respective capacitors, and a second common point via respective SQUIDs. As shown in FIG. 4, fixed qubits 402, 404, and 406 are connected to respective capacitors 450, 452, and 454, and are joined at common point 430 to capacitor 456, therefore establishing a direct "all-to-all" coupling. Capacitors 450, 452, 454, and 456 may resemble capacitors described in quantum device 200 and quantum device 300, according to some embodiments. Quantum device 400 additionally shows fixed qubits 402, 404, and 406 being connected to respective SQUIDs 410, 412, and 414, and are joined at a second common point 432 to SQUID 416. SQUIDs 410, 412, 414, and 416 are represented by "flux" in FIG. 4 in order to demonstrate their purpose in bringing respective incoming fluxes to quantum device 400. The effective coupling strengths between fixed qubits in such embodiments are tuned by controlling said incoming flux through respective SQUIDs. In some embodiments, SQUIDs 410, 412, 414, and 416 may represent the "tunable elements" that enable control of the coupling strengths between the fixed qubits in quantum device 400. Additionally, both capacitor 456 and SQUID 416 are connected to ground 470. As described herein, even though FIG. 4 shows three fixed qubits, N number of fixed qubits, with respective SQUIDs and capacitors, may be used to implement quantum device 400.

In some embodiments, the flux at common point 430 may be denoted as $\phi_C$ and the flux at common point 432 as $\phi_L$. In such embodiments, the linearly-approximated Lagrangian function of quantum device 400 may be written as:

$$L = \sum \left(-\frac{\phi_i^2}{2L_0}\right) + \sum_i \left[-\frac{(\phi_i - \phi_L)^2}{2L\left(\phi_{ext}^{(i)}\right)}\right] - \frac{C}{2}(\dot{\phi}_i - \dot{\phi}_C)^2 - \frac{C_0 \dot{\phi}_i^2}{2},$$

where $\phi_i$ is the flux at fixed qubit i in quantum device 400, and $L_0$ and $C_0$ are the inductance and capacitance at the given fixed qubit (e.g., the given fixed qubit's Josephson junction in embodiments in which fixed qubits are superconducting qubits).

In some embodiments, a linear approximation of the respective SQUIDs may be used in relation to the fixed qubits, and $L(\phi_{ext}^{(i)})$ may be denoted as the effective inductance generated by the given SQUID connected qubit i within quantum device 400. Such may be the case for SQUID 410 and fixed qubit 402, SQUID 412 and fixed qubit 404, and SQUID 414 and fixed qubits 406, for example. Then, SQUID 416, located at common point 432, may have a higher energy. Together, the effective interaction between the fixed qubits may then be described as:

$$H_{int} = \sum_{i \neq j} (g_L |f_i(t)||f_j(t)| - g_C) \sigma_+^{(i)} \sigma_-^{(j)},$$

where $f_i(t)$ are positive (e.g. $f(t) \in [1, \infty)$) and tunable functions.

In the embodiments shown in FIG. 4, the optimization equations then require a matrix K that, for any i≠j obeys:

$$\sum_{n=1}^{N} K_n^{(i)} K_n^{(j)} = J_{ij},$$

and in which case N=M. In some embodiments, the diagonal of J may then be defined in such a way that would make J a positive definite matrix, and, therefore, a possible solution may be to take K=√J (e.g., a symmetric matrix). In some embodiments, this may also be solved numerically.

Given such a solution, the tunable functions $f_i(t)$ may be controlled in the following way:

$$f_i(t) = \sqrt{\frac{g_C}{g_L}} + \sum_{i=1}^{N} \sqrt{2} K_n^{(i)} \cos(\omega nt),$$

for some ω, which may, in part, determine the error rate. Such a drive may require that $$\sqrt{\frac{g_c}{g_L}} - \sum_{i=1}^{N} \sqrt{2} K_{in} \geq 1,$$

which may be achieved if $g_C > g_L$ and by scaling J. In such embodiments, the time-averaged interaction between the fixed qubits may be:

$$H_{int} = \sum_{i \neq j} 2 \left(\sum_n K_n^{(i)} \cos n\omega\right)\left(\sum_m K_m^{(j)} \cos m\omega\right) \sigma_+^{(i)} \sigma_-^{(j)} = J_{ij} \sigma_+^{(i)} \sigma_-^{(j)}.$$

It may be noted that, in such cases, there may no relation between the strength of the modulation and the respective operating frequency, as the respective amplitudes of tunable functions $f_i(t)$ do not change with w, allowing for fast coupling modulations.

FIG. 5 illustrates a fourth example of a quantum device, implemented on quantum hardware, comprising qubits coupled to respective harmonic oscillators, according to some embodiments.

As an alternative embodiment to the star-type geometry, a waveguide-type geometry may be used in which tunable qubits are respectively coupled to harmonic oscillators. As the name suggests, coupling the harmonic oscillators in series with one another effectively causes the quantum device to behave like a waveguide. An example of such a quantum device is shown in FIG. 5, in which tunable qubits 502, 504, and 506 are respectively coupled to harmonic oscillators 510, 512, and 514 via capacitors 550, 552, and 554. Harmonic oscillators 510, 512, and 514 are additionally connected in series via capacitors 556 and 558. Furthermore, in some embodiments, harmonic oscillators 510, 512, and 514, and capacitors 556 and 558 may be referred to as a quantum metamaterial, such as quantum metamaterial 516. In some embodiments, quantum metamaterial 516 establishes an effective "all-to-all" coupling with tunable qubits 502, 504, and 506.

As described above, any number of N tunable qubits and L harmonic oscillators may be used to implement quantum device 500. In some embodiments, tunable qubits 502, 504, and 506 may resemble tunable qubits 202, 204, and 206 and their functionalities described herein.

In some embodiments, the eigenmodes $\alpha_k$ may be found by diagonalizing the harmonic oscillators in quantum device 500. Then, for N tunable qubits and L harmonic oscillators in quantum device 500, the Hamiltonian may be described as:

$$H = \sum_{k=1}^{L} \omega_k a_k^\dagger a_k + \sum_{i=1}^{N} \Delta^{(i)}(t) \frac{[-\sigma_z^{(i)}]}{2} + \sum_{i,k} \gamma_{ik}(\sigma_+^{(i)} a_k + h.c.).$$

The eigenmodes $\alpha_k$ may be described as respective ladder operators of the modes of the waveguide with frequencies $\omega_k$, and $\gamma_{ik}$ may then be described as the coupling strength between tunable qubit i and the respective mode k. The interaction picture with respect to $U_O = \exp\{i\Sigma_k \omega_k \alpha_k^\dagger \alpha_k^r\}$ gives:

$$H_{int}^O = \sum_{i=1}^{N} \Delta^{(i)}(t) \frac{[-\sigma_z^{(i)}]}{2} + \sum_{i,k} \gamma_{ik}(\sigma_+^{(i)} a_k e^{-i\omega_k t} + h.c.).$$

Adding the oscillations of the tunable qubits, $$U = \exp\left(\sum_{i=1}^{N} \int dt \Delta^{(i)}(t) \frac{-\sigma_z}{2}\right),$$

the Hamiltonian becomes:

$$H_{int} = \sum_{i,k} Y_{ik} \left(\sum_{m} K_m^{(i)} e^{i(m\omega - \omega_k)t}\right) \sigma_+^{(i)} a_k + h.c.$$

In some embodiments, the fast oscillations may be averaged up to second order in order to arrive at the James-Effective Hamiltonian:

$$H_{James} = \sum_{i \neq j} \sum_{m=1}^{M} \left\{\sum_{k=1}^{L} \frac{\gamma_{ik}\gamma_{jk}}{\omega_k - m\omega}\left(K_m^{(i)} K_m^{(j)}\right)\right\}\left(\sigma_+^{(i)} \sigma_-^{(j)}\right) + H_{Shift},$$

where $$H_{Shift} = \sum_{i} \sum_{m=1}^{M} \left\{\sum_{k=1}^{L} \frac{\gamma_{ik}^2 \left(K_m^{(i)}\right)^2}{\omega_k - m\omega}\right\}[a_k^\dagger a_k \sigma_z + \sigma_+^{(i)} \sigma_-^{(j)}].$$

It may then be noted that if the coupling to the waveguide is dispersive (e.g., $|\omega_k + L\omega| \gg \gamma_{ik}$), the waveguide may be slightly excited, leading to the approximation $\alpha_k^\dagger \alpha_k = 0$, with respective tunable qubits having an additional shift coming from the $\sigma_+\sigma_-$ term. In the interaction picture with respect to this shift, and given that the shift is common to the tunable qubits, the following may be made true:

$$\sum_{m=1}^{M} \left\{\sum_{k=1}^{L} \frac{\gamma_{ik}^2 \left(K_m^{(i)}\right)^2}{\omega_k - m\omega}\right\} = \text{Total Shift},$$

independent of i (e.g., wherein the shift may be common to the tunable qubits). In some embodiments, this may be seen as an additional requirement on the matrix K, which may be optimized for numerically. The optimization for the J-coupling may then be:

$$\sum_{m=1}^{M} \left\{\sum_{k=1}^{L} \frac{\gamma_{ik}\gamma_{jk}}{\omega_k - m\omega}\left(K_m^{(i)} K_m^{(J)}\right)\right\} = J_{ij},$$

with the additional realness conditions on K.

In embodiments in which the tunable qubits effectively interact with a single mode, say k=1, these equations may be rewritten as:

$$\sum_{m=1}^{M} \left\{\sum_{k=1}^{L} \frac{\gamma_{i1}^2 \left(K_m^{(i)}\right)^2}{\omega_1 - m\omega}\right\} = \text{Total Shift}$$

$$\sum_{m=1}^{M} \left\{\sum_{k=1}^{L} \frac{\gamma_{i1}\gamma_{j1}}{\omega_1 - m\omega}\left(K_m^{(i)} K_m^{(j)}\right)\right\} = J_{ij}$$

which may be again transformed into matrix notation as:

$$U = U_{im} = \frac{\gamma_{i1}}{\sqrt{\omega_1 - m\omega}} K_m^{(i)}$$

$$UU^T = J$$

where the Total-Shift term may define the diagonal of the J matrix.

FIGS. 2, 3, 4, and 5 are four example embodiments of quantum devices that may be implemented by quantum hardware in order to represent a given molecule. Factors, such as qubit lifetime, given characteristics to be modeled, etc., may be used in the decision process for implementing a given quantum device specific to a given molecule, according to some embodiments.

FIG. 6 illustrates a quantum computing service of a service provider network that enables customers to access quantum devices and computers that use multiple quantum computing technologies, according to some embodiments.

Service provider network 600 includes quantum computing service 602. In some embodiments, service provider network 600 may include data centers, routers, networking devices, etc., such as of a cloud computing provider network. In some embodiments, customers 604, 606, and 608 and/or additional customers of service provider network 600 and/or quantum computing service 602, may be connected to the service provider network 600 in various ways, such as via a logically isolated connection over a public network, via a dedicated private physical connection, not accessible to the public, via a public Internet connection, etc.

In some embodiments, a quantum computing service 602 may include a quantum algorithm development kit 614, such as described in more detail in FIG. 8. Also, quantum computing service 602 may include a translation module 612, which may translate a given quantum algorithm into one or more quantum computing technology specific representations, such as an annealing, ion-trap, superconducting, photon-based, and/or another quantum computer compatible representation, such that it may be compatible with one of the quantum hardware providers 620, 622, 624, and 626.

In some embodiments, quantum computing service 602 is connected to quantum hardware providers 620, 622, 624, and 626. In some embodiments, quantum hardware providers 620, 622, 624, and 626 may offer access to run quantum objects and/or quantum devices on quantum computers and/or quantum hardware that operate based on various different types of quantum computing technologies or paradigms, such as based on quantum annealing, ion-trap, superconductive materials, photons, etc. In some embodiments, quantum devices such as quantum devices 200, 300, 400, and 500 may be implemented on quantum hardware of one of the quantum hardware providers. For example, quantum devices 200, 300, 400, and 500 pertain to superconducting qubits, and therefore quantum hardware provider 624 may be used to implement such quantum devices.

In some embodiments, service provider network 600 may also comprise local quantum hardware device 628, which may also be used to run quantum objects and/or quantum devices. For example, quantum devices 200, 300, 400, and/or 500 may be implemented on quantum hardware of local quantum hardware device 628, and measurements described in FIG. 1 may be run locally.

As discussed in more detail in FIG. 7, in some embodiments, a service provider network such as service provider networks 600 and 700 may be extended to include one or more edge computing devices physically located at quantum hardware provider locations, such as in a facility of quantum hardware providers 620, 622, 624, and 626. Physically locating an edge computing device of a service provider network 600 on premises at a quantum hardware provider facility may extend data security and encryption of the service provider network 600 into the quantum hardware providers 620, 622, 624, and 626 facilities, thus ensuring the security of customer data. Also, physically locating an edge computing device of a service provider network 600 on premises at a quantum hardware provider facility may reduce latency between a compute instance of the service provider network and a quantum computer located at the quantum hardware provider facility. Thus, some applications, such as hybrid algorithms that are sensitive to network latencies may be performed by quantum computing service 602, whereas other systems without co-located classical compute capacity at a hardware provider location may have too high of latencies to perform such hybrid algorithms efficiently.

In some embodiments, quantum computing service 602 includes a back-end API transport module 610. In some embodiments, the back-end API transport module 610 may be primarily implemented on edge computing devices of the quantum computing service that are located at the quantum hardware provider locations (such as edge computing devices 704a, 704b, 704c, and 704d illustrated in FIG. 7). Also, in some embodiments, at least some of the back-end API transport functionality may be implemented on the one or more computing devices of the service provider network that implement the quantum computing service (such as computing devices in data center 706a, 706b, 706c illustrated in FIG. 7).

Quantum circuits that have been translated by translation module 612 may be provided to back-end API transport module 610 in order for the translated quantum circuits to be transported to a quantum computer at a respective quantum hardware provider location. In some embodiments, any of the quantum devices (e.g. quantum analog devices, quantum simulation devices, etc.) described above in FIGS. 2-5 may be communicated to a quantum hardware provider as a translated quantum circuit (designed by the quantum computing service) that is to be implemented on the quantum hardware of the quantum hardware providers. In some embodiments, back-end API transport 610 may be a non-public API that is accessible by an edge computing device of service provider network 600, but that is not publicly available. In some embodiments, edge computing devices at the quantum hardware providers 620, 622, 624, and 626 may periodically ping a quantum computer service side interface to the back-end API transport 610 to determine if there are any quantum circuits waiting to be transported to the edge computing device. If so, the edge computing device may perform an API call to the back-end API transport 610 to cause the quantum circuit to be transported over a private connection to the edge computing device and scheduled for execution on a quantum computer. The edge computing device may queue the quantum circuit for execution on a quantum computer of the quantum hardware provider where the edge computing device is located. Also, the edge computing device may have been configured with a quantum machine image that enables the edge computing device to interface with a scheduling application of the quantum hardware provider, where the edge computing device is located, in order to schedule a time slot on the quantum computer of the quantum hardware provider to execute the quantum circuit via the back-end API transport 610.

In some embodiments, results of executing the quantum circuit on the quantum computer at the quantum hardware provider location may be returned to the edge computing device at the quantum hardware provider location. In some embodiments, the edge computing device may perform and/or control modulations, as described above, and cause subsequent measurement rounds to be performed on modulated quantum devices until convergence is reached. The edge computing device and/or quantum computing service 602 may cause the results to be stored in a data storage system of the service provider network 600. In some embodiments, results storage/results notification module 616 may coordinate storing results and may notify a customer, such as customer 604, that the results are ready from the execution of the customer's quantum object, such as a quantum task, quantum algorithm, or quantum circuit. In some embodiments, results storage/results notification module 616 may cause storage space in a data storage service to be allocated to a customer to store the customer's results. Also, the results storage/results notification module 616 may specify access restrictions for viewing the customer's results in accordance with customer preferences.

In some embodiments, quantum computing service 602 includes quantum hardware provider recommendation/selection module 618. In some embodiments, quantum hardware recommendation/selection module 618 may make a recommendation to a quantum computing service customer as to which type of quantum computer or which quantum hardware provider to use to execute a quantum object and/or device submitted by the customer. Additionally, or alternatively, the quantum hardware provider recommendation/selection module 618 may receive a customer selection of a quantum computer type and/or quantum hardware provider to use to execute the customer's quantum object, such as a quantum task, quantum algorithm, quantum circuit, quantum device, etc. submitted by the customer or otherwise defined with customer input.

In some embodiments, a recommendation provided by quantum hardware provider recommendation/selection module 618 may be based on one or more characteristics of a quantum object submitted by a customer and one or more characteristics of the quantum hardware providers supported by the quantum computing service 602, such as one or more of quantum hardware providers 620, 622, 624, or 626.

In some embodiments, a customer may select a problem domain for a problem to be solved using quantum computing service 602 via quantum algorithm development kit 614, such as a "chemistry" problem domain. The customer may further provide information about a molecule to be examined, such as an NMR scan via quantum algorithm development kit 614, and the quantum algorithm development kit 614 may work with quantum hardware provider recommendation/selection module 618 to select a quantum hardware provider to implement a quantum device (e.g. quantum analog device, quantum simulation device, as described above) on behalf of the customer. Thus, in some embodiments, QHP selection may be performed by quantum computing service 602 on behalf of the customer, based on the selected problem domain and problem type, without requiring the customer to directly select a QHP.

FIG. 7 illustrates an implementation of the service provider network in which customers and quantum hardware providers are connected to the service provider network via direct connections and/or network connections, according to some embodiments.

In some embodiments, service provider network 700, which may resemble service provider network 600 and the functionalities described herein in relation to service provider network 600, may include one or more data centers connected to each other via private or public network connections. Also, edge computing devices located at quantum hardware provider locations may be connected to a service provider network via private or public network connections. For example, service provider network 700 illustrated in FIG. 7 includes data centers 706a, 706b, and 706c that are connected to one another via private physical network links of the service provider network 700. In some embodiments, a customer of the service provider network may also be connected via a private physical network link that is not available to the public to carry network traffic, such as a physical connection at a router co-location facility. For example, customer 710 is connected to a router associated with data center 706c via direct connection 724. In a similar manner, edge computing devices located at quantum hardware provider locations may be connected to a service provider network via a private physical network link that is not available to carry public network traffic.

For example, edge computing device 704a located at quantum hardware provider location 702a is connected to a router at data center 706a via direct connection 718. In a similar manner, edge computing device 704b at quantum hardware provider location 702b is connected to a router at data center 706b via direct connection 720. Also, edge computing device 704c at quantum hardware provider 702c is connected to a router at data center 706c via direct connection 722.

Also, in some embodiments an edge computing device of a service provider network located at a quantum hardware provider location may be connected to the service provider network via a logically isolated network connection over a shared network connection, such as via the Internet or another public network. For example, edge computing device 704d at quantum hardware provider location 702d is connected to data center 706c via a logically isolated network connection via network 716. In a similar manner, in some embodiments a customer, such as customer 714, may be connected to service provider network 700 via public network 712.

In some embodiments, a quantum computing service such as quantum computing service 702, may be implemented using one or more computing devices, such as those described in FIG. 10, in any of data centers 706a, 706b, 706c, etc. Also the quantum computing service 702, may provide customers, such as customer 714 or customer 710, access to quantum computers in any of quantum hardware provider locations 702a, 702b, 702c, 702d, etc. For example, a customer may not be restricted to using a quantum hardware provider in a local region where the customer is located. Instead, the customer may be allocated compute instances instantiated on a local edge computing device located at a selected quantum hardware provider location, such that the location of the customer does not restrict the customer's access to various types of quantum computing technology based quantum computers.

In some embodiments, one or more of the data centers 706 may also include local quantum hardware devices, such as local QPUs 726. Local QPUs may resemble local quantum hardware device 628, described in FIG. 6.

FIG. 8 illustrates an example quantum computing service quantum algorithm development kit interface, according to some embodiments.

In some embodiments, a quantum algorithm development kit may support multiple paradigms for defining a quantum circuit. For example, different paradigms may be tailored to customers with different levels of expertise in designing quantum circuits.

For example, a less experienced customer may select a problem-domain based paradigm. For example, the customer may select problem domain quantum task button 806 to display a problem-domain based interface for designing a quantum circuit. The problem-domain based interface may include pre-configured quantum algorithms designed for performing particular functions associated with one or more respective problem domains. A customer of the quantum computing service may select an applicable problem-domain for a problem to be solved by the customer, such as the selected chemistry domain 816. Also within a given problem-domain, the customer may select one or more pre-configured quantum algorithm tools from the pre-configured quantum algorithms for the selected problem-domain in order to define a quantum algorithm be performed by the quantum computing service as the quantum computing object, such as a quantum circuit. For example, FIG. 8 illustrates an example view of the quantum algorithm development kit 814 when the problem domain quantum task design option 806 is selected. In some embodiments, the quantum task/algorithm/circuit design space 804 may display a quantum object currently being defined via a given selected design paradigm.

As another example, an intermediate level customer may select a facilitated quantum algorithm design paradigm. The facilitated quantum algorithm design paradigm may be configured such that the quantum computing service 602 facilitates design of a quantum circuit using customer configurable building blocks without the customer being required to understand all the nuances of designing a quantum circuit. For example, a customer may select facilitated quantum algorithm design button 808 to display a quantum algorithm based interface for designing a quantum circuit. The quantum algorithm based interface may include pre-configured quantum logic elements configured to be arranged with one another to form a quantum algorithm, wherein a customer of the quantum computing service selects and/or arranges the pre-configured quantum logic elements to define a particular quantum algorithm to be performed by the quantum computing service as the quantum computing object.

Additionally, as another example, a more experienced customer may select a detailed quantum circuit based design paradigm. For example, a quantum circuit design based paradigm may give the customer greater control to customize parameters of a quantum circuit, but may also require the customer to have greater knowledge about quantum computers in order to be able to successfully design a quantum circuit using the quantum circuit based design paradigm. For example, a customer may select detailed quantum circuit design button 810 to display a quantum circuit based interface for designing a quantum circuit. The quantum circuit based interface may include quantum operators and connectors, wherein a customer of the quantum computing service combines the quantum operators and connectors to define a particular quantum circuit to be executed by the quantum computing service 602 as a quantum computing object.

In some embodiments, a quantum algorithm development kit 814 may provide a customer with multiple problem domains to select from when a problem-domain design paradigm is selected. For example, FIG. 8 illustrates quantum algorithm development kit 814 with problem domain quantum task design button 806 selected. The quantum algorithm development kit presents a quantum task design space 804 along with a plurality of problem domains for a customer to select from. For example, quantum algorithm development kit 814 provides problem domain options for: a chemistry domain 816, a physics domain 818, a pharmaceutical domain 820, a biotechnology domain 822, a medical modelling domain 824, an information security domain 826, a machine learning domain 828, a process simulation domain 830, a physical modelling domain 832, an optimization problem domain 834 and/or other problem domains 836. Note that the problem domains shown in FIG. 8 are provided as example problem domains that may be supported by a quantum algorithm development kit 814 and should not be interpreted as an exhaustive list of all problem domains that may be supported.

A quantum algorithm development kit 814 may be configured to provide a customer with domain specific design tools 814 based on which of the problem domains is selected. For example, if the chemistry domain 816 is selected, domain-specific tools such as chemistry domain tools 840 may be displayed, and may include pre-configured quantum algorithms typically used to solve chemistry related problems. In a similar manner, if the physics domain 818 is selected, domain-specific tools may include pre-configured quantum algorithms typically used to solve physics related problems. If other ones of the problem domains are selected, the domain-specific tools may be adjusted accordingly to include pre-configured quantum algorithms useful for solving problems in a given selected problem domain.

In embodiments shown in FIG. 8, chemistry domain 816 is selected, and domain-specific tools may comprise NMR simulation tool 842, molecular structure reduction tool 844, and other tools 846 that may be relevant to the construction of quantum circuits within the chemistry domain. NMR simulation tool 842 may provide one or more quantum device designs, such as quantum devices 200, 300, 400, and 500, that may be used in quantum circuit construction and design, and may also suggest initialization parameters for one or more components of the given quantum devices in preparation for measurements pertaining to tuning of coupling strengths between qubits (e.g., fixed, tunable). Molecular structure reduction tool 844 may pertain to the decoding, error correction, and/or reduction of results from said measurements. As described herein, once the relationship between controlling of coupling strengths and J-coupling has been established, post-processing may comprise reducing the molecular structure of the given molecule being simulated after results pertaining to J-coupling have been obtained.

In some embodiments, selecting a particular one of the tools of chemistry domain tools 840 may cause a pre-configured quantum algorithm element to be added to the quantum object (e.g. quantum task/algorithm/circuit) being designed in quantum task design space 804. The customer may then modify the pre-configured quantum algorithm element, arrange it with other pre-configured quantum algorithm elements to define the quantum object, or provide input parameters or other parameters to the pre-configured quantum algorithm element or the overall quantum object being defined.

In some embodiments, a customer may save a quantum object designed in quantum task design space 804 for later use. Also, in some embodiments, a customer may contribute a quantum object designed in quantum design space 804 to a sharing application, such as a marketplace that enables other customers of the quantum computing service to use the quantum object. For example, a chemistry customer may define a quantum object for determining an energy state for a particular molecule and may submit the quantum object for determining the energy state for the particular molecule to a shared marketplace. This may allow other customers of the quantum computing service to use the already defined quantum object to solve similar problems. Also, in some embodiments, the customer may be compensated when another customer uses the customer's pre-defined quantum object. In other embodiments a pre-configured solution marketplace may be open source, such that the customer grants access to the customer's pre-defined quantum object with the expectation of being able to access other quantum objects defined by other customers to solve other problems, such as determining energy states of other molecules.

In some embodiments, a customer may select a pre-defined quantum object from a pre-configured solution marketplace and may further modify or combine the pre-defined quantum object with other elements to form a new quantum object. This may be done in quantum task design space 804. The customer may then cause the modified quantum object to be executed on a quantum computer and/or provide the modified quantum object back to the pre-configured solution marketplace.

Figure 9:
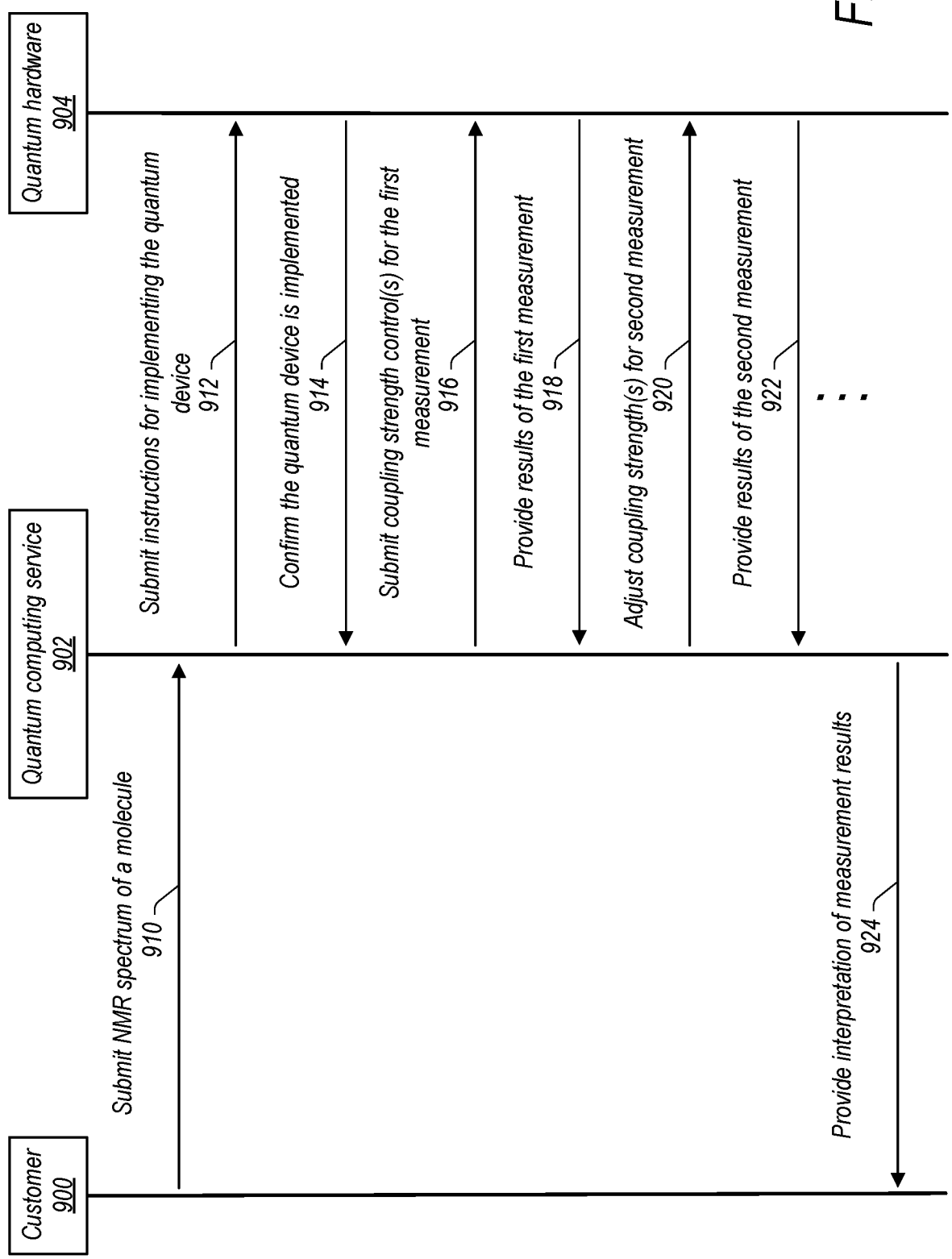
FIG. 9 illustrates an example sequence of events in which a customer of the quantum computing service may submit information about a molecule to the quantum computing service and a given quantum device, implemented on quantum hardware, may be used to iteratively determine one or more characteristics of the molecule before the results are provided to the customer, according to some embodiments.

FIG. 9 illustrates an example sequence of events in which a customer of the quantum computing service may submit information about a molecule to the quantum computing service and a given quantum device, implemented on quantum hardware, may be used to iteratively determine one or more characteristics of the molecule before the results are provided to the customer, according to some embodiments.

In some embodiments, quantum computing service 902 may resemble quantum computing service 602, in which customer 900, which may also resemble customers 604, 606, and 608, interacts with quantum computing service 902. In such embodiments, quantum computing service may communicate with quantum hardware 904, wherein quantum hardware 904 may refer to local quantum hardware, such as local quantum hardware device 628, or remote quantum hardware, such as quantum hardware of quantum hardware providers 620, 622, 624, and 626.

Customer 900 may submit an NMR spectrum of a given molecule to quantum computing service 902 in 910 with the intention of having quantum computing service 902 deduce the J-coupling within the molecule through the process of controlling coupling strengths of qubits within a given quantum device. Customer 900 may additionally submit other relevant information, such as information described in block 100. Customer 900 may also define one or more characteristics about the molecule that customer 900 specifies for quantum computing service 902 to deduce through measurements on quantum hardware such as quantum hardware 904. Quantum computing service 902 may then submit instructions for implementing a given quantum device onto quantum hardware 904 in 912. Such instructions may resemble generated instructions described in block 102. Quantum computing service may then receive a confirmation that the quantum device has been successfully implemented onto quantum hardware 904 in 914 using an allocation of resources of the quantum hardware.

Steps 916, 918, 920, and 922 may then resemble the iterative process described in blocks 104, 106, 108, 110, and 112, according to some embodiments. Step 916 may comprise classical computing devices of quantum computing service 902 submitting initialization parameters and/or properties to quantum hardware 904 in advance of the first round or set of measurements. After the first measurements have been made, results of the first measurements are provided to quantum computing service 902. The process may continue (e.g., steps 920 and 922) until convergence to the one or more characteristics of the molecule has been reached. In some embodiments, one or more post-processing steps may occur within quantum computing service, as described herein, before the results are provided to customer 900 in 924. Such post-processing steps may provide relationships between the measurement results and the one or more characteristics of the molecule that were converged upon, such that quantum computing service 902 may provide an interpretation of said results to customer 900, according to some embodiments.

FIG. 10 is a block diagram illustrating an example classical computing device that may be used in at least some embodiments.

Illustrative Computer System

FIG. 10 illustrates such a general-purpose classical computing device 1000 as may be used in any of the embodiments described herein. In the illustrated embodiment, classical computing device 1000 includes one or more processors 1010 coupled to a system memory 1020 (which may comprise both non-volatile and volatile memory modules) via an input/output (I/O) interface 1030. Classical computing device 1000 further includes a network interface 1040 coupled to I/O interface 1030.

In various embodiments, classical computing device 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA. In some implementations, graphics processing units (GPUs) may be used instead of, or in addition to, conventional processors.

System memory 1020 may be configured to store instructions and data accessible by processor(s) 1010. In at least some embodiments, the system memory 1020 may comprise both volatile and non-volatile portions; in other embodiments, only volatile memory may be used. In various embodiments, the volatile portion of system memory 1020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 1020 as code 1025 and data 1026.

In some embodiments, I/O interface 1030 may be configured to coordinate I/O traffic between processor 1010, system memory 1020, and any peripheral devices in the device, including network interface 1040 or other peripheral interfaces such as various types of persistent and/or volatile storage devices. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between classical computing device 1000 and other devices 1060 attached to a network or networks 850, such as other computer systems or devices as illustrated in FIG. 1 through FIG. 9, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may represent one embodiment of a computer-accessible medium configured to store at least a subset of program instructions and data used for implementing the methods and apparatus discussed in the context of FIG. 1 through FIG. 9. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to classical computing device 1000 via I/O interface 1030. A non-transitory computer-accessible storage medium may also include any volatile or non-volatile media such as RAM (e.g., SDRAM, DDR SDRAM, RDRAM, SRAM, etc.), ROM, etc., that may be included in some embodiments of classical computing device 1000 as system memory 1020 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 1040. Portions or all of multiple computing devices such as that illustrated in FIG. 10 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "classical computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g., SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
one or more computing devices configured to:
receive a nuclear magnetic resonance spectrum corresponding to a given molecule; and
generate instructions for modeling characteristics of the nuclear magnetic resonance spectrum on a quantum device implemented using quantum hardware, the quantum device comprising:
two or more qubits coupled together with respective coupling strengths;
the one or more computing devices further configured to:
tune the respective coupling strengths, wherein to tune comprises:
control, via modulation, the coupling strengths for a given set of one or more measurements;
compare results of the given set of one or more measurements to the received nuclear magnetic resonance spectrum;
adjust at least one of the coupling strengths; and
iteratively perform one or more additional controls, one or more additional comparisons, and one or more additional adjustments until convergence of current given results to the one or more characteristics of the nuclear magnetic resonance spectrum; and
provide, responsive to the convergence of the current given results to the one or more characteristics of the nuclear magnetic resonance spectrum, the current given results.

2. The system of claim 1, wherein the coupling strengths for the given set of the one or more measurements are controlled via the modulation of respective operating frequencies of the two or more qubits.

3. The system of claim 2, wherein the respective operating frequencies for at least two of the two or more qubits are different.

4. The system of claim 1, wherein:
the one or more computing devices are implemented as part of a quantum computing service of a provider network, the one or more computing devices further configured to:
receive, via an interface of the quantum computing service, the nuclear magnetic resonance spectrum generated by or on behalf of a customer of the quantum computing service;
provide, to a quantum hardware provider, instructions for implementing the quantum device using quantum hardware of the quantum hardware provider, wherein the instructions for implementing the quantum device are based at least in part on the instructions for modeling the characteristics of the nuclear magnetic resonance spectrum on the quantum device;
coordinate, responsive to the quantum device being implemented using the quantum hardware of the quantum hardware provider, the tuning of the respective coupling strengths, wherein:
responsive to the convergence of the current given results to the one or more characteristics of the nuclear magnetic resonance spectrum, the current given results are provided to the customer.

5. The system of claim 4, wherein the quantum hardware provider is external to the provider network.

6. A system, comprising:
quantum hardware configured to implement a quantum device based on instructions for modeling characteristics of information for a given molecule, wherein the quantum device comprises two or more qubits coupled together with respective coupling strengths;
one or more computing devices configured to:
receive the information corresponding to the given molecule; and
generate the instructions for modeling the characteristics of the received information on the quantum device; and
tune the respective coupling strengths until convergence of iterated results to the one or more characteristics of the received information, wherein to tune comprises:
control, via modulation, the coupling strengths for a given set of one or more measurements;

compare results of the given set of one or more measurements to the received information;

adjust at least one of the coupling strengths; and iteratively perform one or more additional controls, one or more additional comparisons, and one or more additional adjustments until the convergence; and provide, responsive to the convergence of the iterated results to the one or more characteristics of the received information, the iterated results.

7. The system of claim 6, wherein the two or more qubits coupled together are respectively connected to one another via a common connection point.

8. The system of claim 7, wherein the two or more qubits are two or more tunable qubits and the coupling strengths are controlled via the modulation of respective operating frequencies of the two or more tunable qubits.

9. The system of claim 7, further comprising two or more respective tunable couplers coupled with respective ones of the two or more qubits, wherein the coupling strengths are controlled, at least in part, via the two or more tunable couplers.

10. The system of claim 7, further comprising two or more respective superconducting quantum interference devices coupled with respective ones of the two or more qubits, wherein the coupling strengths are controlled, at least in part, via the two or more superconducting quantum interference devices.

11. The system of claim 6, wherein the two or more qubits coupled together are respectively connected to one another via respective harmonic oscillators.

12. The system of claim 6, wherein:

the one or more computing devices and the quantum hardware are implemented as part of a quantum computing service of a provider network, the one or more computing devices further configured to:

receive, via an interface of the quantum computing service, the information generated on behalf of a customer of the quantum computing service, wherein the received information comprises an experimentally-measured nuclear magnetic resonance spectrum;

provide, responsive to the generation of the instructions for modeling the characteristics of the received information on the quantum device, the instructions to the quantum hardware;

coordinate, responsive to the quantum device being implemented using the quantum hardware, the tuning of the respective coupling strengths, wherein:

responsive to the convergence of the current given results to the one or more characteristics of the received information, the iterated results are provided to the customer.

13. The system of claim 6, wherein the comparison of the results of the given set of the one or more measurements to the received information comprises:

reproduction of at least one or more characteristics of a modeled nuclear magnetic resonance spectrum generated using the results; and comparison of the at least one or more characteristics to the received information, wherein the received information comprises an experimentally-measured nuclear magnetic resonance spectrum corresponding to the given molecule.

14. The system of claim 13, wherein the comparison of the at least one or more reproduced characteristics is used to determine that the convergence has been reached.

15. The system of claim 6, wherein the generation of the instructions for modeling the one or more characteristics of the molecule on the quantum device comprises:

mapping a number of qubits of the two or more qubits coupled together to respective atoms of the molecule, wherein:

the received information comprises a molecular structure of the molecule;

the molecular structure is used to determine the number of qubits; and the respective atoms of the molecule correspond to a subset of total atoms of the molecule.

16. A method, comprising:

receiving information corresponding to a given molecule;

generating instructions for modeling one or more characteristics of the given molecule on a quantum device, implemented using quantum hardware, wherein the quantum device comprises qubits coupled together with respective coupling strengths; and tuning the respective coupling strengths until convergence of iterated results to the one or more characteristics of the received information, wherein tuning comprises:

controlling, via modulation, the coupling strengths for a given set of one or more measurements;

comparing results of the given set of one or more measurements to the received information;

adjusting at least one of the coupling strengths; and iteratively performing, at least once, said controlling, said comparing, and said adjusting until the convergence of the iterated results to the one or more characteristics of the received information; and providing, responsive to the convergence of the iterated results to the one or more characteristics of the received information, the iterated results.

17. The method of claim 16, wherein said generating the instructions for modeling the one or more characteristics of the molecule on a quantum device comprises:

determining, via the received information, a number of qubits of the qubits coupled together required to model the one or more characteristics of the given molecule on the quantum device, wherein the received information comprises a molecular structure of the given molecule.

18. The method of claim 17, wherein said generating the instructions for modeling the one or more characteristics of the molecule on a quantum device further comprises:

mapping the number of qubits to respective atoms of the given molecule, wherein the respective atoms represent a subset of total atoms of the molecule.

19. The method of claim 16, wherein said comparing the results of the given set of the one or more measurements to the received information comprises:

reproducing a modeled nuclear magnetic resonance spectrum via the results and comparing the modeled nuclear magnetic resonance spectrum to the received information, wherein the received information comprises an experimentally-measured nuclear magnetic resonance spectrum corresponding to the given molecule.

20. The method of claim 16, wherein the iterated results are used to determine one or more characteristics about J-coupling of the given molecule.

* * * * *